United States Patent
Ren et al.

(10) Patent No.: US 11,854,765 B2
(45) Date of Patent: Dec. 26, 2023

(54) MULTIPLE CHARGED-PARTICLE BEAM APPARATUS AND METHODS

(71) Applicant: ASML Netherlands B.V., Veldhoven (NL)

(72) Inventors: Weiming Ren, San Jose, CA (US); Xuedong Liu, San Jose, CA (US); Xuerang Hu, San Jose, CA (US); Zhong-wei Chen, San Jose, CA (US); Martinus Gerardus Johannes Maria Maassen, San Francisco, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/885,872

(22) Filed: May 28, 2020

(65) Prior Publication Data

US 2020/0381211 A1  Dec. 3, 2020

Related U.S. Application Data

(60) Provisional application No. 62/984,760, filed on Mar. 3, 2020, provisional application No. 62/853,670, filed on May 28, 2019.

(51) Int. Cl.
*H01J 37/317* (2006.01)
*H01J 37/145* (2006.01)
*H01J 37/28* (2006.01)

(52) U.S. Cl.
CPC ........ *H01J 37/3177* (2013.01); *H01J 37/145* (2013.01); *H01J 37/28* (2013.01); *H01J 2237/0453* (2013.01)

(58) Field of Classification Search
CPC ....... H01J 37/00–32422; H01J 37/3177; H01J 37/145; H01J 37/28; H01J 2237/0453; H01J 37/14; H01J 37/10

(Continued)

(56) References Cited

U.S. PATENT DOCUMENTS 8,258,484 B2 * 9/2012 Wieland .............. H01J 37/3177
                                                  250/396 R
9,922,799 B2   3/2018 Li et al.
(Continued)

FOREIGN PATENT DOCUMENTS

JP    2018520495 A    7/2018
JP    2020-503644 A   1/2020
(Continued)

OTHER PUBLICATIONS

International Search Report issued by the International Searching Authority in related PCT Application No. PCT/EP2020/063829, dated Aug. 3, 2020 (5 pgs.).

(Continued)

*Primary Examiner* — David E Smith
(74) *Attorney, Agent, or Firm* — FINNEGAN, HENDERSON, FARABOW, GARRETT & DUNNER, LLP

(57) ABSTRACT

Systems and methods of mitigating Coulomb effect in a multi-beam apparatus are disclosed. The multi-beam apparatus may include a charged-particle source configured to generate a primary charged-particle beam along a primary optical axis, a first aperture array comprising a first plurality of apertures having shapes and configured to generate a plurality of primary beamlets derived from the primary charged-particle beam, a condenser lens comprising a plane adjustable along the primary optical axis, and a second aperture array comprising a second plurality of apertures configured to generate probing beamlets corresponding to the plurality of beamlets, wherein each of the plurality of probing beamlets comprises a portion of charged particles of a corresponding primary beamlet based on at least a position of the plane of the condenser lens and a characteristic of the second aperture array.

17 Claims, 18 Drawing Sheets

(58) Field of Classification Search
USPC .................................................. 250/396 R
See application file for complete search history.

(56) References Cited

U.S. PATENT DOCUMENTS

| | | | |
|---|---|---|---|
| 2008/0054184 A1* | 3/2008 | Knippelmeyer | H01J 37/09 |
| | | | 250/396 ML |
| 2017/0025241 A1* | 1/2017 | Li | H01J 37/28 |
| 2017/0025243 A1 | 1/2017 | Ren et al. | |
| 2019/0066974 A1 | 2/2019 | Schubert et al. | |
| 2021/0043416 A1* | 2/2021 | Wang | H01L 27/1464 |

FOREIGN PATENT DOCUMENTS

| | | |
|---|---|---|
| TW | 201832265 A | 9/2018 |
| TW | 201841186 A | 11/2018 |
| WO | WO 2018/122176 A1 | 7/2018 |

OTHER PUBLICATIONS

Office Action of the Intellectual Property Office in Taiwan dated May 7, 2021, and a Search Report, corresponding with ROC (Taiwan) Patent Application No. 109116841. (12 pages).

Notice of Reasons for Rejection issued in related Japanese Patent Application No. 2021-567033; dated Dec. 1, 2022 (9 pgs.).

\* cited by examiner

MULTIPLE CHARGED-PARTICLE BEAM APPARATUS AND METHODS

CROSS-REFERENCE TO RELATED APPLICATIONS

This application claims priority of U.S. application 62/853,670 which was filed on May 28, 2019, and U.S. application 62/984,760 which was filed on Mar. 3, 2020, which are incorporated by reference in their entireties.

TECHNICAL FIELD

The embodiments provided herein disclose a multi-beam apparatus, and more particularly a multi-beam charged particle microscope including an aperture array with apertures configured to accommodate variations in beam current and beam position and to mitigate the Coulomb effect.

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) can be employed. As the physical sizes of IC components continue to shrink, accuracy and yield in defect detection become more important. Although multiple electron beams may be used to increase the throughput, the limitation in variation of probe current may limit the imaging resolution desired for reliable defect detection and analysis rendering the inspection tools inadequate for their desired purpose.

SUMMARY

In one aspect of the present disclosure, a charged-particle beam apparatus is disclosed. The charged-particle beam apparatus comprises a charged-particle source configured to generate a primary charged-particle beam along a primary optical axis, a first aperture array comprising a first plurality of apertures configured to generate a plurality of primary beamlets from the primary charged-particle beam, a condenser lens comprising a plane adjustable along the primary optical axis, and a second aperture array comprising a second plurality of apertures configured to generate a plurality of probing beamlets. Each of the plurality of probing beamlets comprises a portion of charged particles of a corresponding primary beamlet, and the portion of the charged particles is determined based on at least a position of the plane of the condenser lens and characteristics of the second aperture array.

The first aperture array may comprise a pre-beamlet forming aperture array disposed between the charged-particle source and the condenser lens. The first aperture array may comprise an on-axis aperture configured to generate an on-axis beamlet, the on-axis beamlet being incident on an on-axis aperture of the second aperture array. The first aperture array may further comprise an off-axis aperture configured to generate an off-axis beamlet, the off-axis beamlet incident on a corresponding off-axis aperture of the second aperture array. The off-axis aperture of the first aperture array may comprise an elongated aperture having rounded ends and a tapering width. The off-axis aperture of the first aperture array may comprise an elongated aperture having rounded ends and a tapering width and has a curved form. The off-axis aperture may be oriented such that the width tapers towards the primary optical axis.

The condenser lens may be configured to cause a portion of the off-axis beamlet to form a corresponding probing beamlet of the plurality of probing beamlets. The condenser lens may be configured to cause a portion of the off-axis beamlet to form a corresponding probing beamlet of the plurality of probing beamlets. The second plurality of apertures may be configured to determine a size and a shape of the plurality of probing beamlets. The characteristics of the second aperture array may comprise at least one of sizes, shapes, and arrangement of the second plurality of apertures. The condenser lens may comprise an electrostatic, electromagnetic, or an electromagnetic compound lens.

The first plurality of apertures may comprise a plurality of off-axis apertures. The plurality of off-axis apertures may include an aperture having a first off-axis aperture overlapping with a second off-axis aperture, wherein the first off-axis aperture enables the second aperture array to generate a first-off axis probing beamlet and the second off-axis aperture enables the second aperture array to generate a second off-axis probing beamlet. Each of the plurality of off-axis apertures of the first aperture array may be separated by a substrate material of the first aperture array. The on-axis aperture of the first aperture array may be substantially circular and an area of the on-axis aperture of the first aperture array is substantially similar to an area of the off-axis aperture.

In another aspect of the present disclosure, a first aperture array of a charged-particle beam apparatus is disclosed. The first aperture array may comprise a first plurality of apertures configured to generate a plurality of primary beamlets from a primary charged-particle beam. The portion of charged particles of a primary beamlet of the plurality of primary beamlets forms a corresponding probing beamlet of a plurality of probing beamlets, and the portion of the charged particles is determined based on at least a position of a plane of a condenser lens and characteristics of a second aperture array, wherein the second aperture array is configured to generate the plurality of probing beamlets.

In yet another aspect of the present disclosure, a method of observing a sample using a multi-beam apparatus is disclosed. The method may include activating a charged-particle source to generate a primary charged-particle beam, generating a plurality of primary beamlets from the primary charged-particle beam using a first aperture array, generating a plurality of probing beamlets corresponding to the plurality of primary beamlets using a second aperture array, adjusting a position of a plane of a condenser lens along a primary optical axis in relation to the first and the second aperture array, and generating, from the plurality of probing beamlets, a plurality of probe spots incident on a surface of the sample, wherein each of the plurality of probing beamlets comprises a portion of charged particles of a corresponding primary beamlet of the plurality of primary beamlets, and wherein the portion of the charged particles is determined based on at least a position of the plane of the condenser lens and characteristics of the second aperture array.

Adjusting the position of the plane of the condenser lens may modify characteristics of the probing beamlets including currents of the probing beamlets. Generating the plurality of primary beamlets may comprise generating an on-axis beamlet and an off-axis beamlet. The method may further include causing, using the condenser lens, a portion of the off-axis beamlet to form a corresponding probing beamlet of the plurality of probing beamlets.

In yet another aspect of the present disclosure, a non-transitory computer readable medium storing a set of instructions that is executable by one or more processors of a multi-beam apparatus having first and second aperture arrays is disclosed. The set of instructions may cause the multi-beam apparatus to perform a method of observing a sample using a multi-beam apparatus. The method may include activating a charged-particle source to generate a primary charged-particle beam and adjusting a position of a plane of a condenser lens along a primary optical axis in relation to the first and the second aperture array, wherein the first aperture array is configured to generate a plurality of primary beamlets from the primary charged-particle beam using a first plurality of apertures, a portion of charged particles of a primary beamlet of the plurality of primary beamlets forms a corresponding probing beamlet, and the portion of the charged particles is determined based on at least a position of the plane of the condenser lens and characteristics of the second aperture array.

In yet another aspect of the present disclosure, a charged-particle beam apparatus is disclosed. The charged-particle beam apparatus may comprise a charged-particle source configured to generate a primary charged-particle beam along a primary optical axis, a first aperture array comprising multiple sets of apertures configured to form a plurality of primary beamlets from the primary charged-particle beam, a condenser lens disposed on a plane normal to the primary optical axis, and a second aperture array comprising a plurality of apertures configured to generate a plurality of probing beamlets. A probing beamlet of the plurality of probing beamlets is associated with a set of apertures of the first aperture array, and an aperture of the set of apertures forming the probing beamlet is determined at least based on a characteristic of the condenser lens.

The first aperture array may comprise a pre-beamlet forming aperture array disposed between the charged-particle source and the condenser lens. The first aperture array may further comprise an on-axis aperture configured to generate an on-axis primary beamlet, the on-axis primary beamlet being incident on an on-axis aperture of the second aperture array. The on-axis aperture of the first aperture array may be substantially circular. The first aperture array may comprise the multiple sets of off-axis apertures configured to generate a plurality of off-axis primary beamlets, an off-axis primary beamlet being incident on a corresponding off-axis aperture of the second aperture array.

A set of the multiple sets of off-axis apertures may include apertures disposed along a curved path. A set of the multiple sets of off-axis apertures may include at least two apertures having a different size. A set of the multiple sets of off-axis apertures may include apertures that are sized to determine a current of the corresponding primary beamlet. A set of the multiple sets of off-axis apertures may include apertures having a uniform pitch. A set of the multiple sets of off-axis apertures may include apertures having a non-uniform pitch. The multiple sets of off-axis apertures may comprise apertures having a circular, rectangular, elliptical, or a polygonal cross-section.

The condenser lens may be configured to cause a primary beamlet of the plurality of primary beamlets to form a corresponding probing beamlet of the plurality of probing beamlets. The condenser lens may comprise an electrostatic, electromagnetic, or an electromagnetic compound lens. The second aperture array may comprise a beam-limiting aperture array disposed between the condenser lens and an objective lens. The second plurality of apertures may be configured to determine a size and a shape of the plurality of probing beamlets.

In yet another aspect of the present disclosure, a first aperture array of a charged-particle beam apparatus is disclosed. The first aperture array may comprise multiple sets of apertures configured to form a plurality of primary beamlets from the primary charged-particle beam. A probing beamlet of a plurality of probing beamlets is associated with a set of the multiple sets of apertures of the first aperture array and an aperture of the set of apertures forming the probing beamlet is determined at least based on a characteristic of a condenser lens.

In yet another aspect of the present disclosure, a method of observing a sample using a multi-beam apparatus is disclosed. The method may comprise activating a charged-particle source to generate a primary charged-particle beam, generating a plurality of primary beamlets from the primary charged-particle beam using a first aperture array, adjusting a position of a plane of a condenser lens along a primary optical axis in relation to the first and the second aperture array, and generating a plurality of probe spots incident on a surface of the sample from the plurality of probing beamlets. A probing beamlet of the plurality of probing beamlets may be associated with a set of apertures of the first aperture array, and an aperture of the set of apertures forming the probing beamlet is determined at least based on a characteristic of the condenser lens.

Adjusting the position of the plane of the condenser lens may modify characteristics of the probing beamlet. Adjusting the position of the plane of the condenser lens may modify current of the probing beamlet. Generating the plurality of primary beamlets may comprise generating an on-axis primary beamlet and an off-axis primary beamlet.

The method of observing a sample using a multi-beam apparatus may further comprise causing an off-axis primary beamlet to form a corresponding probing beamlet of the plurality of probing beamlets using the condenser lens.

In yet another aspect of the present disclosure, a non-transitory computer readable medium storing a set of instructions that is executable by one or more processors of a multi-beam apparatus having first and second aperture arrays is disclosed. The set of instructions may cause the multi-beam apparatus to perform a method of observing a sample using a multi-beam apparatus. The method may include activating a charged-particle source to generate a primary charged-particle beam and adjusting a position of a plane of a condenser lens along a primary optical axis in relation to the first aperture array and the second aperture array, wherein the first aperture array is configured to generate a plurality of primary beamlets from the primary charged-particle beam using a plurality of set of apertures, a primary beamlet of the plurality of primary beamlets forms a corresponding probing beamlet, and an aperture of the set of apertures forming the probing beamlet is determined at least based on a characteristic of the condenser lens.

In yet another aspect of the present disclosure, a charged-particle beam apparatus is disclosed. The apparatus may comprise a first aperture array comprising a first plurality of apertures configured to form a plurality of primary beamlets from a primary charged-particle beam. An aperture of the first plurality of apertures may comprise a first aperture plate configured to be at a first voltage, and a second aperture plate configured to be at a second voltage that is different from the first voltage for generating an electric field, which enables adjustment of a path of a charged particle of the primary charged-particle beam. The apparatus may further comprise a third aperture plate configured to be at third voltage that is substantially similar to the first voltage. The apparatus may further comprise a condenser lens comprising a plane adjustable along a primary optical axis, and a second aperture array comprising a second plurality of apertures configured to generate a plurality of probing beamlets, wherein each of the plurality of probing beamlets comprises a portion of charged particles of a corresponding primary beamlet and the portion of the charged particles is based on at least a position of a plane of the condenser lens and a characteristic of the second aperture array.

The first and the third voltages may comprise a reference voltage. The second aperture plate may comprise a charged-particle beam deflector configured to adjust the path of the charged particles in response to an electrical activation. The charged-particle beam deflector may comprise a single-pole deflector or a multi-pole deflector. The electrical activation of the second aperture plate may comprise a voltage signal being applied to generate the electric field. The path of the charged particles is adjusted based on a characteristic of the voltage signal applied to the second aperture plate. The characteristic of the voltage signal may comprise a polarity or an amplitude. An aperture of the first plurality of apertures may comprise a first aperture in the first aperture plate, a second aperture in the second aperture plate, and a third aperture in the third aperture plate, wherein the second aperture plate is disposed between the first and the third aperture plates, and wherein a geometric center of the first, the second, and the third apertures are aligned. The first and the second apertures may be dissimilar in size, and the first and the third apertures may be substantially similar in size.

The third aperture plate may be configured to block a portion of charged particles exiting the second aperture. The first aperture array may comprise a pre-beamlet forming aperture array disposed between a charged-particle source and the condenser lens. The first aperture array may comprise an on-axis aperture configured to generate an on-axis beamlet, the on-axis beamlet being incident on an on-axis aperture of the second aperture array. The first aperture array comprises an off-axis aperture configured to generate an off-axis beamlet, the off-axis beamlet incident on a corresponding off-axis aperture of the second aperture array. The off-axis aperture of the first aperture array may comprise an elongated aperture having rounded ends and a tapering width. The off-axis aperture of the first aperture array may comprise an elongated aperture having rounded ends and a tapering width and has a curved form. The off-axis aperture may be oriented such that the width tapers towards the primary optical axis.

The condenser lens may be configured to cause a portion of the off-axis beamlet to form a corresponding probing beamlet of the plurality of probing beamlets. The condenser lens may be configured to cause a portion of the off-axis beamlet to form a corresponding probing beamlet of the plurality of probing beamlets. The second plurality of apertures may be configured to determine a size and a shape of the plurality of probing beamlets. The characteristic of the second aperture array may comprise at least one of sizes, shapes, and arrangement of the second plurality of apertures. The condenser lens may comprise an electrostatic, electromagnetic, or an electromagnetic compound lens.

The first plurality of apertures may comprise a plurality of off-axis apertures. The plurality of off-axis apertures may include an aperture having a first off-axis aperture overlapping with a second off-axis aperture, wherein the first off-axis aperture enables the second aperture array to generate a first-off axis probing beamlet and the second off-axis aperture enables the second aperture array to generate a second off-axis probing beamlet. Each of the plurality of off-axis apertures of the first aperture array may be separated by a substrate material of the first aperture array. The on-axis aperture of the first aperture array may be substantially circular and an area of the on-axis aperture of the first aperture array is substantially similar to an area of the off-axis aperture.

In yet another aspect of the present disclosure, a method of observing a sample using a charged-particle beam apparatus is disclosed. The method may include activating a charged-particle source to generate a primary charged-particle beam; generating, using a first aperture plate and a second aperture plate of a first aperture array, a plurality of primary beamlets from the primary charged-particle beam, wherein the first aperture plate operates at a first voltage and the second aperture plate operates at a second voltage that is different from the first voltage for adjusting a path of a charged particle exiting the first aperture plate; generating, using a second aperture array, a plurality of probing beamlets corresponding to the plurality of primary beamlets; and generating, from the plurality of probing beamlets, a plurality of probe spots incident on a surface of the sample. The method may further comprise operating a third aperture plate at a third voltage substantially similar to the first voltage, wherein the first and the third voltage comprise a reference voltage. The method may further comprise adjusting, by electrically activating the second aperture plate, the path of the charged particle, wherein electrically activating the second aperture plate comprises applying a voltage signal to generate the electric field. The method may further comprise adjusting a position of a plane of a condenser lens along a primary optical axis in relation to the first and the second aperture array, wherein adjusting the position of the plane of the condenser lens modifies a characteristic of the plurality of probing beamlets, and wherein adjusting the position of the plane of the condenser lens modifies currents of the plurality of probing beamlets, and wherein generating the plurality of primary beamlets comprises generating an on-axis beamlet and an off-axis beamlet. The method may further include causing, using the condenser lens, a portion of the off-axis beamlet to form a corresponding probing beamlet of the plurality of probing beamlets.

In yet another aspect of the present disclosure, a non-transitory computer readable medium storing a set of instructions that is executable by one or more processors of a multi-beam apparatus having first and second aperture arrays is disclosed. The set of instructions may cause the multi-beam apparatus to perform a method of observing a sample using a multi-beam apparatus. The method may include activating a charged-particle source to generate a primary charged-particle beam; generating, using first, second, and third aperture plates of a first aperture array, a plurality of primary beamlets from the primary charged-particle beam, wherein the first and third aperture plates operate at substantially a first voltage and the second aperture plate operates at a second voltage that is different from the first voltage for adjusting a path of a charged particle exiting the first aperture plate; generating, using a second aperture array, a plurality of probing beamlets corresponding to the plurality of primary beamlets; and generating, from the plurality of probing beamlets, a plurality of probe spots incident on a surface of the sample.

In yet another aspect of the present disclosure, a charged-particle beam apparatus is disclosed. The apparatus may comprise a first aperture array comprising a first plurality of apertures configured to form a plurality of primary beamlets from a primary charged-particle beam. An aperture of the first plurality of apertures may comprise a first aperture plate configured to be at a first voltage; and a second aperture plate configured to be at a second voltage that is different from the first voltage for generating an electric field between the first and the second aperture plate; and a second aperture array configured to generate a probing beamlet from a corresponding primary beamlet, wherein a beam current of the probing beamlet is adjustable. The electric field between the first and the second aperture plate may be substantially fixed, and wherein the beam current is discretely adjusted based on a size of the aperture of the first plurality of apertures in the first aperture array. The electric field between the first and the second aperture plate may be adjustable, and wherein the beam current is adjusted based on the electric field between the first and the second aperture plate.

In yet another aspect of the present disclosure, a method of observing a sample using a charged-particle beam apparatus is disclosed. The method may comprise activating a charged-particle source to generate a primary charged-particle beam; generating, using a first aperture plate and a second aperture plate of a first aperture array, a plurality of primary beamlets from the primary charged-particle beam, wherein the first aperture plate operates at a first voltage and the second aperture plate operates at a second voltage that is different from the first voltage, for adjusting a path of a charged particle exiting the first aperture plate; generating, using a second aperture array, a probing beamlet from a corresponding primary beamlet, wherein a beam current of the probing beamlet is adjustable; and generating, from the probing beamlet, a probe spot incident on a surface of the sample. The method may further comprise adjusting the path of the charged particle wherein adjusting the path comprises deflecting the charged particle based on an electric field formed between the first and the second aperture plate. The electric field between the first and the second aperture plate may be substantially fixed, and wherein adjusting the beam current of the probing beamlet is based on a size of an aperture of the first aperture array. The electric field between the first and the second aperture plate may be adjustable, and wherein adjusting the beam current of the probing beamlet comprises adjusting the electric field between the first and the second aperture plate. Deflecting the charged particle may be caused by electrically activating the second aperture plate by applying a voltage signal to generate the electric field. The method may further comprise operating a third aperture plate at a third voltage substantially similar to the first voltage, wherein the first and the third voltage comprise a reference voltage.

In yet another aspect of the present disclosure, a non-transitory computer readable medium storing a set of instructions that is executable by one or more processors of a multi-beam apparatus having first and second aperture arrays to cause the multi-beam apparatus to perform a method. The method may comprise activating a charged-particle source to generate a primary charged-particle beam; generating, using a first aperture plate and a second aperture plate of a first aperture array, a plurality of primary beamlets from the primary charged-particle beam, wherein the first aperture plate operates at a first voltage and the second aperture plate operates at a second voltage that is different from the first voltage, for adjusting a path of a charged particle exiting the first aperture plate; generating, using a second aperture array, a probing beamlet from a corresponding primary beamlet, wherein a beam current of the probing beamlet is adjustable; and generating, from the probing beamlet, a probe spot incident on a surface of the sample.

In yet another aspect of the present disclosure, a charged-particle beam apparatus is disclosed. The apparatus may comprise a set of pre-beamlet forming apertures configured to form a plurality of primary beamlets from a primary charged-particle beam, and a beam-limit aperture configured to form a probing beamlet from a corresponding primary beamlet, wherein a beam current of the probing beamlet is determined based on a characteristic of an aperture of the set of pre-beamlet forming apertures forming the primary beamlet. The characteristic of the aperture of the set of pre-beamlet forming apertures may comprise a size, a shape, or a location of the aperture. The beam current of the probing beamlet may be discretely adjusted based on the size of the aperture of the set of pre-beamlet forming apertures. The apparatus may comprise a first array of a plurality of sets of pre-beamlet forming apertures, and a second array of a plurality of beam-limit apertures disposed downstream of the first array along a primary optical axis of the primary charged-particle beam. The aperture of the set of pre-beamlet forming apertures forming the probing beamlet may be determined at least based on a characteristic of a condenser lens, wherein the characteristic of the condenser lens may comprise a position of a plane of the condenser lens along the primary optical axis. A change of the position of the plane of the condenser lens may be configured to affect the beam current of the probing beamlet. The condenser lens may be configured to influence the beam current of the probing beamlet by directing a portion of the primary charged-particle beam to pass through a different aperture of the set of pre-beamlet forming apertures. The condenser lens located in a first position of the plane may be configured to cause a first portion of the primary charged-particle beam to pass through a first aperture of the set of pre-beamlet forming apertures to form a first primary beamlet; and the condenser lens located in a second position of the plane may be configured to cause a second portion of the primary charged-particle beam to pass through a second aperture of the set of pre-beamlet forming apertures to form a second primary beamlet.

The first array may comprise an on-axis aperture configured to generate an on-axis primary beamlet, the on-axis primary beamlet being incident on an on-axis aperture of the second array and the set of pre-beamlet forming apertures may comprise a plurality of off-axis pre-beamlet forming apertures configured to generate an off-axis primary beamlet, the off-axis primary beamlet incident on a corresponding off-axis beam-limit aperture of the second array. Each of the off-axis pre-beamlet forming apertures may be separated by a substrate material of the first array. The plurality of off-axis pre-beamlet forming apertures may be disposed along a curved path. The plurality of off-axis pre-beamlet forming apertures may include at least two apertures having a different size. The plurality of off-axis pre-beamlet forming apertures may be sized to determine a beam current of the primary beamlet generated upon passing through an aperture of the plurality of off-axis pre-beamlet forming apertures. Apertures of the plurality of off-axis pre-beamlet forming apertures may have a uniform pitch or a non-uniform pitch.

Other advantages of the embodiments of the present disclosure will become apparent from the following description taken in conjunction with the accompanying drawings wherein are set forth, by way of illustration and example, certain embodiments of the present invention.

DETAILED DESCRIPTION

Figure 1:
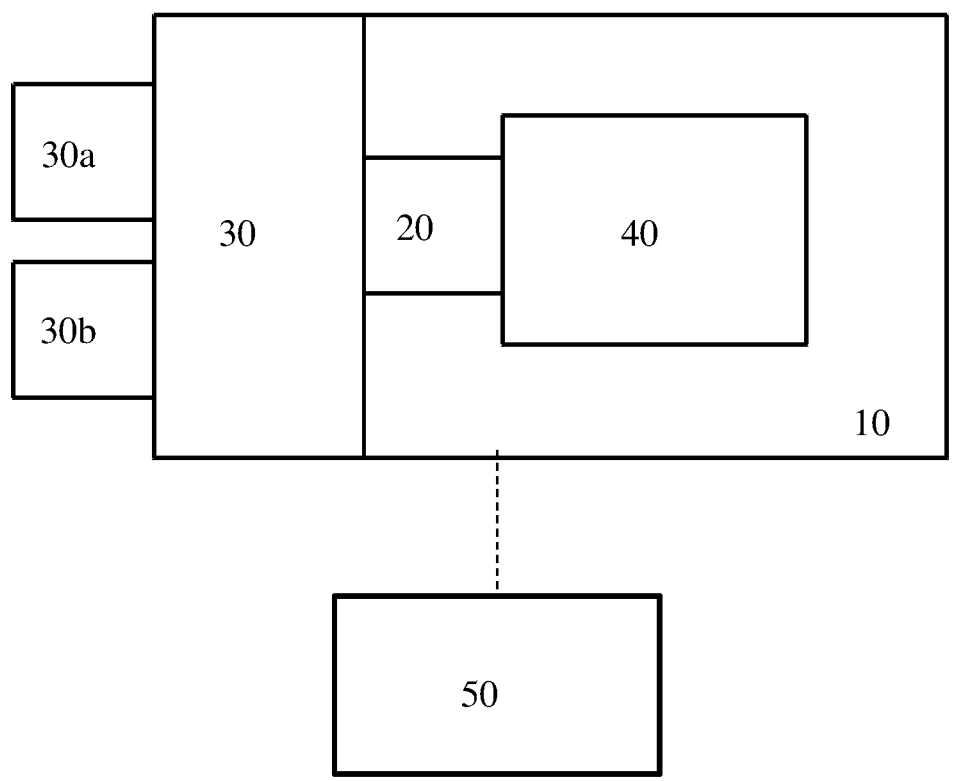
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations. Instead, they are merely examples of apparatuses and methods consistent with aspects related to the disclosed embodiments as recited in the appended claims. For example, although some embodiments are described in the context of utilizing electron beams, the disclosure is not so limited. Other types of charged particle beams may be similarly applied. Furthermore, other imaging systems may be used, such as optical imaging, photo detection, x-ray detection, etc.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than $1/1000$th the size of a human hair.

Making these extremely small ICs is a complex, time-consuming, and expensive process, often involving hundreds of individual steps. Errors in even one step have the potential to result in defects in the finished IC rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). An SEM can be used to image these extremely small structures, in effect, taking a "picture" of the structures. The image can be used to determine if the structure was formed properly and also if it was formed in the proper location. If the structure is defective, then the process can be adjusted so the defect is less likely to recur.

Although a multiple charged-beam particle imaging system, such as a multi-beam SEM, may be useful in increasing the wafer inspection throughput, the imaging resolution of multi-beam SEM may be negatively affected by the Coulomb interaction effects. In order to achieve high throughput, it is desirable that the beam contains as many electrons as possible. However, due to the repulsive Coulomb interaction between electrons, it is difficult to confine a large number of electrons in a very small volume. Moreover, these interactions may broaden the width of the beam and change the direction of the flight of electrons. As a result, the probe spot will be larger, thus negatively impacting the overall resolution of the SEM. Therefore, it is desirable to mitigate the Coulomb interaction effects for maintaining high resolution of multi-beam SEMs.

To alleviate the Coulomb interaction effects, an aperture array may be placed close to the electron source to cut-off peripheral electrons or split the primary electron beam into multiple beamlets. However, adjusting the probing beam current to adjust resolution may result in a change of the beam path through the aperture array. One of the several problems that may be encountered is that the apertures of the aperture array may not be configured to allow beams of various sizes and positions to pass through while maintaining a small enough area to mitigate Coulomb interaction effects.

Furthermore, because the imaging resolution may be adversely affected by Coulomb interaction effects, it may be desirable to maintain uniformity of overall areas of the apertures, despite their non-uniform shapes, to accommodate variations in probing beam currents. Variations in Coulomb interaction effects between apertures of the aperture array may result in non-uniformity of resolution of regions within the same image, affecting the user's ability to detect and identify defects, for example.

In conventional SEMs and multi-beam SEMs, a size of the probing electron beam or the probe spot size may determine the imaging resolution. For example, a large probe spot having high beam current may result in poor resolution, and a small probe spot having low beam current may result in better resolution. Poor imaging resolution from large beam spot sizes may partly be attributed to enhanced Coulomb interaction effects in high current beams.

A large range of beam currents may be desired in a multibeam SEM tool to perform various operations during wafer inspection. For example, high current beams may be used to perform low resolution, macroscopic inspection of large areas on a wafer, and low current, high resolution scans may be desired to perform thorough defect investigation on a microscopic or a nanoscopic level. One of the several ways to generate a large range of beam currents from a single source of electrons in a multibeam SEM may include increasing the size or the length of the apertures through which the electrons may pass. However, multiple large apertures may not only increase the Coulomb interaction effects but may also negatively affect the mechanical integrity of the aperture array. Therefore, it may be desirable to have an imaging tool, for example, a multibeam SEM that enables providing a large range of beam currents while reducing the Coulomb interaction effects and maintaining the mechanical integrity of the aperture array.

In some embodiments of the present disclosure, a multi-beam apparatus may include an aperture array comprising a plurality of elongated apertures having a tapering width and configured to generate a plurality of beamlets associated with the primary charged-particle beam. The apparatus may also comprise a condenser lens on an adjustable plane along a primary optical axis, and a second aperture array comprising a plurality of apertures configured to generate probing beamlets. The shapes of the first plurality of apertures are based on paths of corresponding beamlets associated with adjustable probe currents of the probing beamlets, on the adjustability of the plane of the condenser lens, and on characteristics of the second aperture array such as sizes, shapes and positioning of the apertures.

In some embodiments of the present disclosure, a multi-beam apparatus may include a first aperture array comprising a plurality of sets of apertures configured to form a plurality of primary beamlets from the primary charged-particle beam. The apparatus may also include a second aperture array comprising a plurality of apertures configured to generate a plurality of probing beamlets. A probing beamlet may be associated with a set of apertures and the aperture of the set of apertures forming the probing beamlet may be determined at least based on a characteristic of the condenser lens.

Relative dimensions of components in drawings may be exaggerated for clarity. Within the following description of drawings, the same or like reference numbers refer to the same or like components or entities, and only the differences with respect to the individual embodiments are described. As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

Reference is now made to FIG. 1, which illustrates an exemplary electron beam inspection (EBI) system 100 consistent with embodiments of the present disclosure. As shown in FIG. 1, charged particle beam inspection system 100 includes a main chamber 10, a load-lock chamber 20, an electron beam tool 40, and an equipment front end module (EFEM) 30. Electron beam tool 40 is located within main chamber 10. While the description and drawings are directed to an electron beam, it is appreciated that the embodiments are not used to limit the present disclosure to specific charged particles.

EFEM 30 includes a first loading port 30a and a second loading port 30b. EFEM 30 may include additional loading port(s). First loading port 30a and second loading port 30b receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 30 transport the wafers to load-lock chamber 20.

Load-lock chamber 20 is connected to a load/lock vacuum pump system (not shown), which removes gas molecules in load-lock chamber 20 to reach a first pressure below the atmospheric pressure. After reaching the first pressure, one or more robot arms (not shown) transport the wafer from load-lock chamber 20 to main chamber 10. Main chamber 10 is connected to a main chamber vacuum pump system (not shown), which removes gas molecules in main chamber 10 to reach a second pressure below the first pressure. After reaching the second pressure, the wafer is subject to inspection by electron beam tool 40. In some embodiments, electron beam tool 40 may comprise a single-beam inspection tool. In other embodiments, electron beam tool 40 may comprise a multi-beam inspection tool.

Controller 50 may be electronically connected to electron beam tool 40 and may be electronically connected to other components as well. Controller 50 may be a computer configured to execute various controls of charged particle beam inspection system 100. Controller 50 may also include processing circuitry configured to execute various signal and image processing functions. While controller 50 is shown in FIG. 1 as being outside of the structure that includes main chamber 10, load-lock chamber 20, and EFEM 30, it is appreciated that controller 50 can be part of the structure.

While the present disclosure provides examples of main chamber 10 housing an electron beam inspection system, it should be noted that aspects of the disclosure in their broadest sense, are not limited to a chamber housing an electron beam inspection system. Rather, it is appreciated that the foregoing principles may be applied to other chambers as well.

Figure 2:
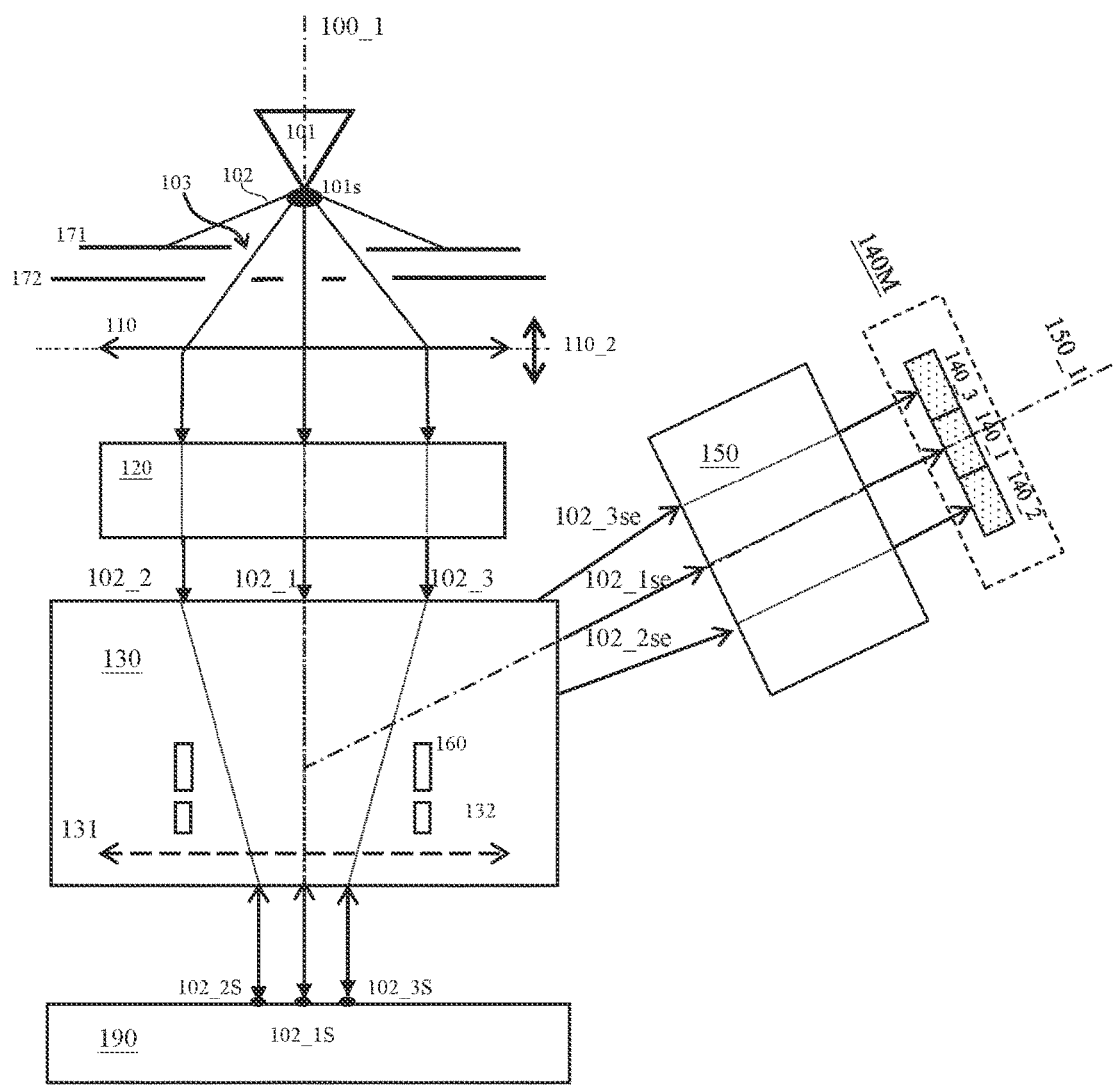
FIG. 2 is a schematic diagram illustrating an exemplary electron beam tool that can be a part of the exemplary electron beam inspection system of FIG. 1, consistent with embodiments of the present disclosure.

Reference is now made to FIG. 2, which illustrates a schematic diagram illustrating an exemplary electron beam tool 40 that can be a part of the exemplary charged particle beam inspection system 100 of FIG. 1, consistent with embodiments of the present disclosure. An electron beam tool 40 (also referred to herein as apparatus 40) comprises an electron source 101, a gun aperture plate 171 with a gun aperture 103, a condenser lens 110, a source conversion unit 120, a primary projection optical system 130, a sample stage (not shown in FIG. 2), a secondary optical system 150, and an electron detection device 140. Primary projection optical system 130 can comprise an objective lens 131. Electron detection device 140 can comprise a plurality of detection elements 140_1, 140_2, and 140_3. Beam separator 160 and deflection scanning unit 132 can be placed inside primary projection optical system 130. It may be appreciated that other commonly known components of apparatus 40 may be added/omitted as appropriate.

Electron source 101, gun aperture plate 171, condenser lens 110, source conversion unit 120, beam separator 160, deflection scanning unit 132, and primary projection optical system 130 can be aligned with a primary optical axis 100_1 of apparatus 100. Secondary optical system 150 and electron detection device 140 can be aligned with a secondary optical axis 150_1 of apparatus 40.

Electron source 101 can comprise a cathode, an extractor or an anode, wherein primary electrons can be emitted from the cathode and extracted or accelerated to form a primary electron beam 102 that forms a crossover (virtual or real) 101s. Primary electron beam 102 can be visualized as being emitted from crossover 101s.

Source conversion unit 120 may comprise an image-forming element array (not shown in FIG. 2), an aberration compensator array (not shown), a beam-limit aperture array (not shown), and a pre-bending micro-deflector array (not shown). The image-forming element array can comprise a plurality of micro-deflectors or micro-lenses to form a plurality of parallel images (virtual or real) of crossover 101s with a plurality of beamlets of primary electron beam 102. FIG. 2 shows three beamlets 102_1, 102_2, and 102_3 as an example, and it is appreciated that the source conversion unit 120 can handle any number of beamlets.

Condenser lens 110 is configured to focus primary electron beam 102. The electric currents of beamlets 102_1, 102_2, and 102_3 downstream of source conversion unit 120 can be varied by adjusting the focusing power of condenser lens 110 or by changing the radial sizes of the corresponding beam-limit apertures within the beam-limit aperture array. The electric currents may be changed by both, altering the radial sizes of beam-limit apertures and the focusing power of condenser lens 110. Condenser lens 110 may be an adjustable condenser lens that may be configured so that the position of its first principle plane is movable. The adjustable condenser lens may be configured to be magnetic, which may result in off-axis beamlets 102_2 and 102_3 illuminating source conversion unit 120 with rotation angles. The rotation angles may change with the focusing power or the position of the first principal plane of the adjustable condenser lens. Accordingly, condenser lens 110 may be an anti-rotation condenser lens that may be configured to keep the rotation angles unchanged while the focusing power of condenser lens 110 is changed. In some embodiments, condenser lens 110 may be an adjustable anti-rotation condenser lens, in which the rotation angles do not change when the focusing power and the position of the first principal plane of condenser lens 110 are varied.

Objective lens 131 may be configured to focus beamlets 102_1, 102_2, and 102_3 onto a sample 190 for inspection and can form three probe spots 102_1s, 102_2s, and 102_3s on surface of sample 190. Gun aperture plate 171 can block off peripheral electrons of primary electron beam 102 not in use to reduce Coulomb interaction effects. Coulomb interaction effects can enlarge the size of each of probe spots 102_1s, 102_2s, and 102_3s, and therefore deteriorate inspection resolution.

Beam separator 160 may be a beam separator of Wien filter type comprising an electrostatic deflector generating an electrostatic dipole field μl and a magnetic dipole field B1 (both of which are not shown in FIG. 2). If they are applied, the force exerted by electrostatic dipole field μl on an electron of beamlets 102_1, 102_2, and 102_3 is equal in magnitude and opposite in direction to the force exerted on the electron by magnetic dipole field B1. Beamlets 102_1, 102_2, and 102_3 can therefore pass straight through beam separator 160 with zero deflection angles.

Deflection scanning unit 132 can deflect beamlets 102_1, 102_2, and 102_3 to scan probe spots 102_1s, 102_2s, and 102_3s over three small scanned areas in a section of the surface of sample 190. In response to incidence of beamlets 102_1, 102_2, and 102_3 at probe spots 102_1s, 102_2s, and 102_3s, three secondary electron beams 102_1se, 102_2se, and 102_3se can be emitted from sample 190. Each of secondary electron beams 102_1se, 102_2se, and 102_3se can comprise electrons with a distribution of energies including secondary electrons (energies ≤50 eV) and backscattered electrons (energies between 50 eV and landing energies of beamlets 102_1, 102_2, and 102_3). Beam separator 160 can direct secondary electron beams 102_1se, 102_2se, and 102_3se towards secondary optical system 150. Secondary optical system 150 can focus secondary electron beams 102_1se, 102_2se, and 102_3se onto detection elements 140_1, 140_2, and 140_3 of electron detection device 140. Detection elements 140_1, 140_2, and 140_3 can detect corresponding secondary electron beams 102_1se, 102_2se, and 102_3se and generate corresponding signals used to construct images of the corresponding scanned areas of sample 190.

In some embodiments, controller 50 may comprise an image processing system that includes an image acquirer (not shown) and a storage (not shown). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to electron detection device 140 of apparatus 40 through a medium such as an electrical conductor, optical fiber cable, portable storage media, IR, Bluetooth, internet, wireless network, wireless radio, among others, or a combination thereof. In some embodiments, the image acquirer may receive a signal from electron detection device 140 and may construct an image. The image acquirer may thus acquire images of sample 190. The image acquirer may also perform various post-processing functions, such as generating contours, superimposing indicators on an acquired image, and the like. The image acquirer may be configured to perform adjustments of brightness and contrast, etc. of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In some embodiments, the image acquirer may acquire one or more images of a sample based on an imaging signal received from electron detection device 140. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 190. The acquired images may comprise multiple images of a single imaging area of sample 190 sampled multiple times over a time sequence. The multiple images may be stored in the storage. In some embodiments, controller 50 may be configured to perform image processing steps with the multiple images of the same location of sample 190.

In some embodiments, controller 50 may include measurement circuitries (e.g., analog-to-digital converters) to obtain a distribution of the detected secondary electrons. The electron distribution data collected during a detection time window, in combination with corresponding scan path data of each of primary beamlets 102_1, 102_2, and 102_3 incident on the wafer surface, can be used to reconstruct images of the wafer structures under inspection. The reconstructed images can be used to reveal various features of the internal or external structures of sample 190, and thereby can be used to reveal any defects that may exist in the wafer.

In some embodiments, controller 50 may control a motorized stage (not shown) to move sample 190 during inspection. In some embodiments, controller 50 may enable the motorized stage to move sample 190 in a direction continuously at a constant speed. In other embodiments, controller 50 may enable the motorized stage to change the speed of the movement of sample 190 over time depending on the steps of scanning process. In some embodiments, controller 50 may adjust a configuration of primary projection system 130 or secondary projection system 150 based on images of secondary electron beams 102_1se, 102_2se, and 102_3se.

Although FIG. 2 shows that electron beam tool 40 uses three primary electron beams, it is appreciated that electron beam tool 40 may use two or more number of primary electron beams. The present disclosure does not limit the number of primary electron beams used in apparatus 40.

Figure 3:
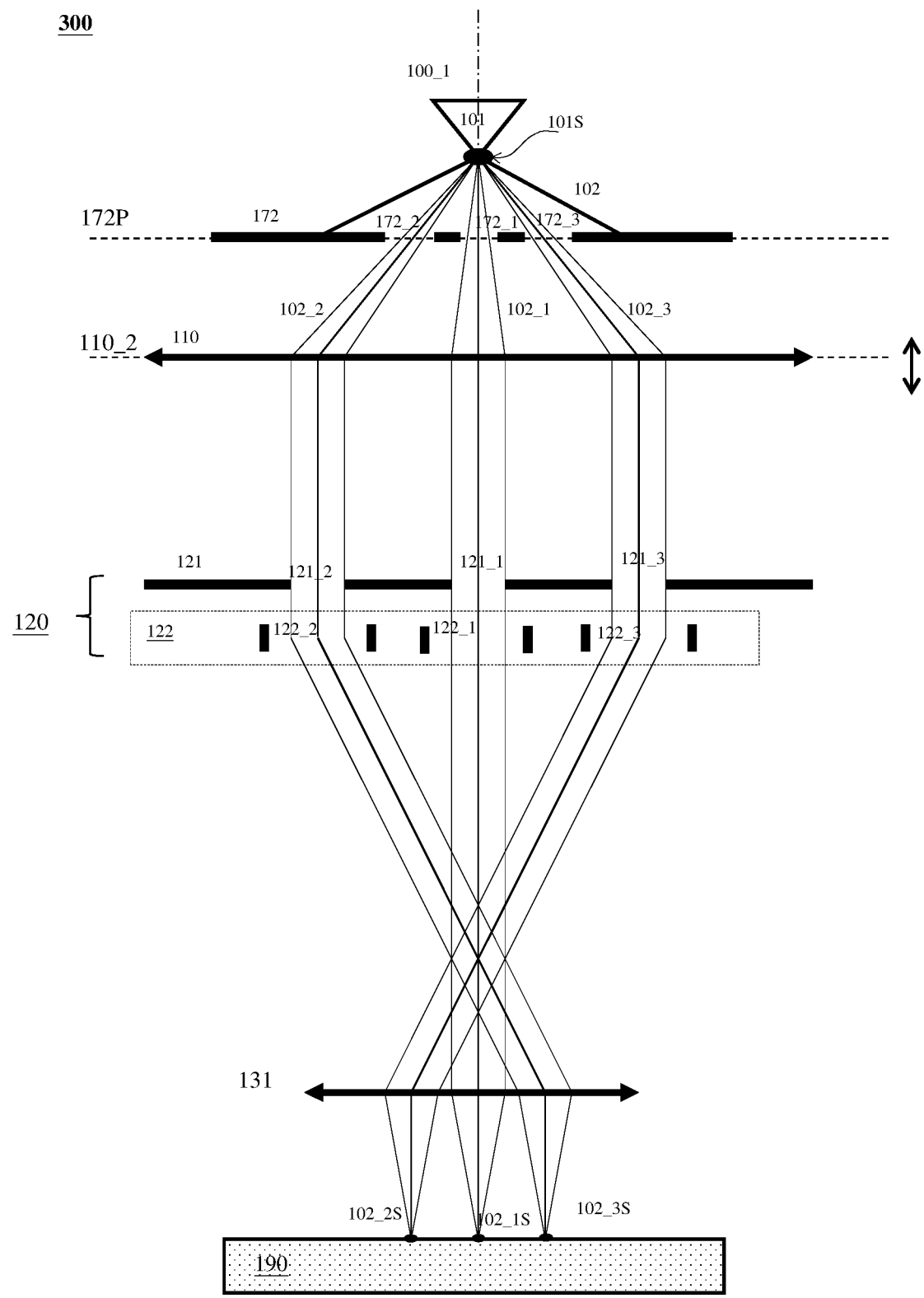
FIG. 3 is a schematic diagram illustrating an exemplary configuration of an adjustable condenser lens in a multi-beam apparatus, consistent with embodiments of the present disclosure.

Reference is now made to FIG. 3, which is a schematic diagram of multi-beam apparatus 300 illustrating an exemplary configuration of adjustable condenser lens 110, consistent with embodiments of the present disclosure. It is appreciated that multi-beam apparatus 300 may be part of charged-particle beam inspection system (e.g., electron beam inspection system 100 of FIG. 1).

Multi-beam apparatus 300 may comprise an electron source 101, a pre-beamlet forming aperture mechanism 172, a condenser lens 110, an objective lens 131, and a source conversion unit 120 comprising a beam limiting aperture array 121 and an image-forming element array 122. In some embodiments, electron source 101 may be configured to emit primary electrons and form a primary electron beam 102. In some embodiments, a gun aperture plate (not shown) may be configured to block off peripheral electrons of primary electron beam 102 to reduce the Coulomb effect. In some embodiments, pre-beamlet-forming aperture mechanism 172 further cuts the peripheral electrons of primary electron beam 102 to reduce the Coulomb effect. Primary-electron beam 102 may be trimmed into three primary electron beamlets 102_1, 102_2, and 102_3 (or any other number of beamlets) after passing through pre-beamlet forming aperture mechanism 172. Electron source 101, gun aperture plate 171, pre-beamlet forming aperture mechanism 172, and condenser lens 110 may be aligned with a primary optical axis 100_1 of multi-beam electron beam tool 300.

In some embodiments, source conversion unit 120 may be provided with beam-limit aperture array 121 and image-forming element array 122. Beam-limit aperture array 121 may comprise beam-limit apertures 121_1, 121_2, and 121_3. Although, FIG. 3 illustrates only three apertures, it is appreciated that any number of apertures may be used, as appropriate. Beam-limit apertures 121_1, 121_2, and 121_3 may limit sizes of beamlets 102_1, 102_2, and 102_3 of primary-electron beam 102. Image-forming element array 122 may comprise image-forming deflectors 122_1, 122_2, and 122_3. Deflectors 122_1, 122_2, and 122_3 may be configured to deflect beamlets 102_1, 102_2, and 102_3 by varying angles towards primary optical axis 100_1. In some embodiments, deflectors further away from primary optical axis 100_1 may deflect beamlets to a greater extent. Furthermore, image-forming element array 122 may comprise multiple layers (not illustrated), and deflectors 122_1, 122_2, and 122_3 may be provided in separate layers. Deflectors 122_1, 122_2, and 122_3 may be individually controlled independent from one another. In some embodiments, a deflector may be controlled to adjust a pitch of probe spots (e.g., 102_1S, 102_2S, and 102_3S) formed on a surface of sample 190. As referred to herein, pitch of the probe spots may be defined as the distance between two immediately adjacent probe spots on the surface of sample 190.

A centrally located deflector of image-forming element array 122 may be aligned with primary optical axis 100_1 of multi-beam apparatus 300. Thus, in some embodiments, a central deflector may be configured to maintain the trajectory of beamlet 102_1 to be straight. In some embodiments, the central deflector may be omitted. However, in some embodiments, primary electron source 101 may not necessarily be aligned with the center of source conversion unit 120. Furthermore, it is appreciated that while FIG. 3 shows a side view of apparatus 300 where beamlet 102_1 is on primary optical axis 100_1, beamlet 102_1 may be off primary optical axis 100_1 when viewed from a different side. That is, in some embodiments, all of beamlets 102_1, 102_2, and 102_3 may be off-axis. An off-axis component may be offset relative to primary optical axis 100_1.

The deflection angles of the deflected beamlets may be set based on one or more criteria.

As shown in FIG. 3, deflectors 122_2 and 122_3 may deflect off-axis beamlets radially outward or away (not illustrated) from primary optical axis 100_1. In some embodiments, deflectors 122_2 and 122_3 may deflect off-axis beamlets radially inward or towards primary optical axis 100_1. Deflection angles of the beamlets may be set so that beamlets 102_1, 102_2, and 102_3 land perpendicularly on sample 190. Off-axis aberrations of images due to lenses, such as objective lens 131, may be reduced by adjusting paths of the beamlets passing through the lenses. Therefore, deflection angles of off-axis beamlets 102_2 and 102_3 generated by deflectors 122_2 and 122_3 may be set so that probe spots 102_2S and 102_3S have small aberrations. Beamlets may be deflected so as to pass through or close to the front focal point of objective lens 131 to decrease aberrations of off-axis probe spots 102_2S and 102_3S. In some embodiments, deflectors may be set to make beamlets 102_1, 102_2, and 102_3 land perpendicularly on sample 1 while probe spots 102_1S, 102_2S, and 1023S have small aberrations.

Pre-beamlet forming aperture mechanism 172 may comprise a Coulomb aperture array. A central aperture, also referred to herein as the on-axis aperture, of pre-beamlet-forming mechanism 172 and a central deflector of source conversion unit 120 may be aligned with primary optical axis 100_1 of multi-beam apparatus 300. Pre-beamlet-forming mechanism 172 may be provided with a plurality of pre-trimming apertures (e.g., a Coulomb aperture array) 172_1, 172_2, and 172_3. Central aperture 172_1 of pre-beamlet-forming mechanism 172 may be aligned with primary optical axis 100_1 and may be provided above condenser lens 110 and close to electron source 101. In FIG. 3, the three beamlets 102_1, 102_2 and 102_3 are generated when primary electron beam 102 passes through the three pre-trimming apertures, and much of the remaining part of primary electron beam 102 is cut off. That is, pre-beamlet-forming mechanism 172 may trim much or most of the electrons from primary electron beam 102 that do not form the three beamlets 102_1, 102_2 and 102_3. Pre-beamlet-forming mechanism 172 may cut off electrons that will ultimately not be used to form probe spots 102_1S, 102_2S and 102_3S before primary electron beam 102 enters source conversion unit 120. In this way, the Coulomb effect above beam-limit aperture array 121 may be reduced to a great degree. As used in this disclosure, "pre-beamlet" refers to the primary beamlet having an intermediate beam current value before entering the beam-limit aperture. In some embodiments, a gun aperture plate (not illustrated) may be provided close to electron source 101 to cut off electrons at an early stage, while pre-beamlet forming mechanism 172 may also be provided to further cut off electrons around a plurality of beamlets. Although FIG. 3 demonstrates three apertures of pre-beamlet forming mechanism 172, it is appreciated that there may be any number of apertures, as appropriate.

In some embodiments, pre-beamlet forming mechanism 172 may be placed below condenser lens 110. Placing pre-beamlet forming mechanism 172 closer to electron source 101 may more effectively reduce the Coulomb effect. In some embodiments, gun aperture plate may be omitted when pre-beamlet forming mechanism 172 is able to be located sufficiently close to source 101 while still being manufacturable. In some embodiments, pre-beamlet forming mechanism 172 may be placed along a plane 172P normal to primary optical axis 100_1.

Condenser lens 110 may be configured to be adjustable for adjusting electric currents of beamlets 102_1, 102_2, and 102_3. Adjustable condenser lens 110 may have a principal plane 110_2 normal to primary optical axis 100_1, as illustrated in FIG. 3. Principal plane 110_2 may be moved along primary optical axis 100_1 of multi-beam apparatus 300. For example, principal plane 110_2 may be moved further away from electron source 101 to reduce the electric currents of beamlets 102_1, 102_2 and 102_3, and principal plane 110_2 may be moved closer to electron source 101 to increase the currents of beamlets 102_1, 102_2 and 102_3. Additionally, currents of beamlets 102_1, 102_2 and 102_3 may be changed by changing sizes of beam-limit apertures 121_1, 121_2, and 121_3 of beam-limit aperture array 121.

Figure 4A:
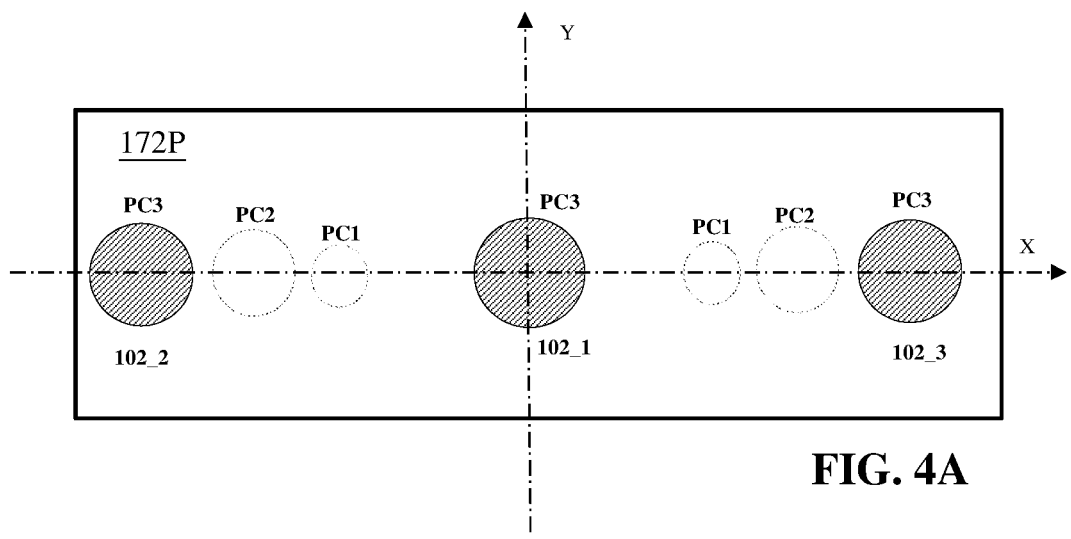
FIGS. 4A-4C are schematic diagrams illustrating exemplary charged-particle beam profiles of varying probe currents on an aperture array in multi-beam apparatus of FIG. 3, consistent with embodiments of the present disclosure.
Figure 4B:
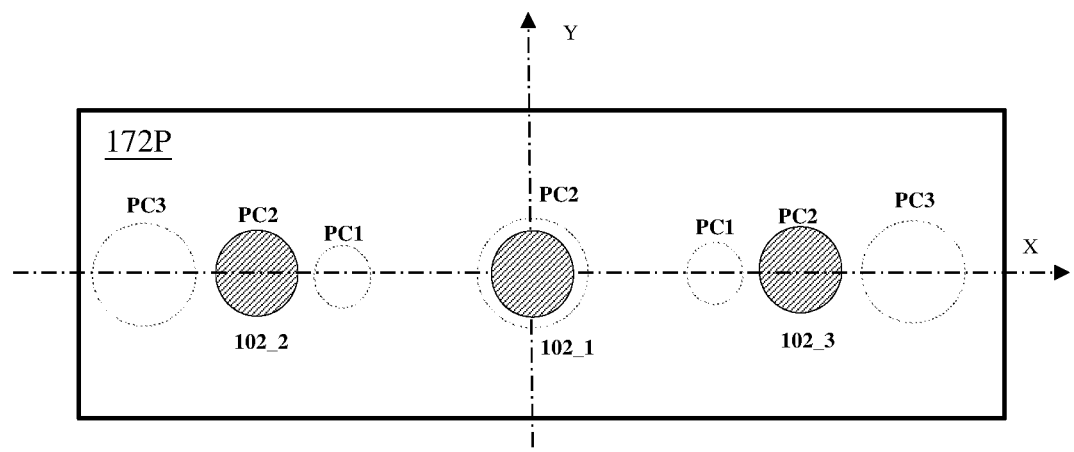
Figure 4C:
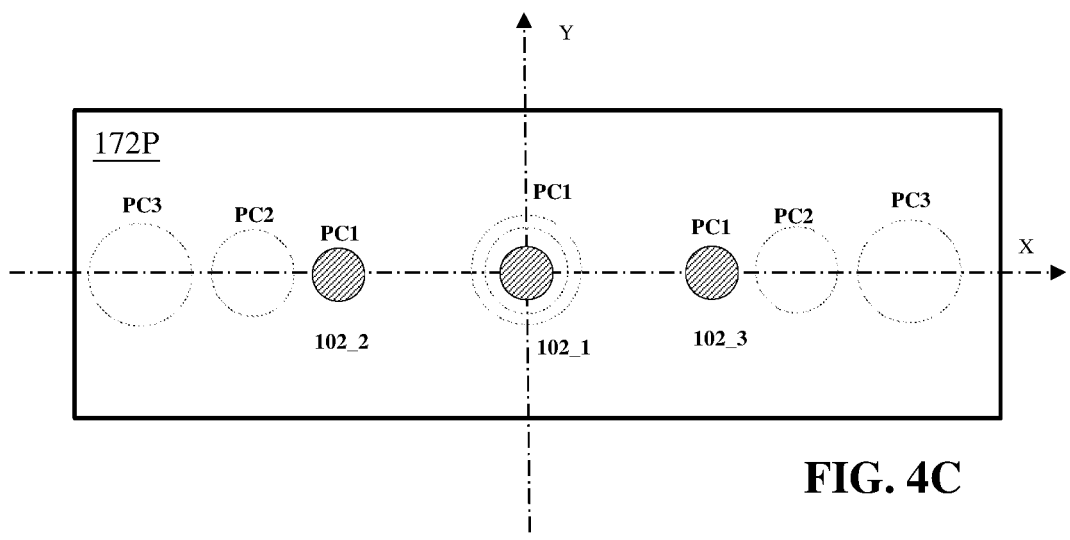

Reference is now made to FIGS. 4A-4C, which illustrate schematic diagrams of exemplary charged-particle beam profiles (e.g., profiles of electron beams) of varying probe currents projected on plane 172P, consistent with embodiments of the present disclosure. Beam profiles (e.g., PC1, PC2, and PC3) represent virtual projections of beamlets exiting beam-limit aperture array 121, on plane 172P. The circles representing the beam profiles are to be considered as visual aids for the size of the probing beamlet exiting beam-limit aperture array and the portion of the beamlet from which the corresponding probing beamlet is generated. FIGS. 4A-4C illustrate beam profiles of beamlets 102_1, 102_2, and 102_3 downstream from beam-limit aperture array 121 in a configuration comprising an adjustable anti-rotation electrostatic condenser lens, in which the rotation angles do not change when the focusing power and the position of principal plane 110_2 of condenser lens 110 are varied. It is appreciated that the beam profiles on plane 172P of pre-beamlet forming mechanism 172 are virtual projections demonstrated for illustrative purposes only.

FIG. 4A illustrates beam profiles of beamlets 102_1, 102_2, and 102_3 having high beam current, represented as probe current 3 (PC3), as projected on plane 172P. The electrons that constitute the beam profiles PC3 may identify a portion of the electrons of each of the beamlets 102_1, 102_2, and 102_3 that pass through the corresponding aperture of beam-limit aperture array 121, while the remaining electrons of beamlets 102_1, 102_2, and 102_3 may be blocked by beam-limit aperture array 121. The electric current of the beamlet passing through an aperture of pre-beamlet forming mechanism 172 may be based on, for example, the position of principal plane 110_2 of condenser lens 110 along primary optical axis 100_1 and the size of the corresponding aperture of beam-limit aperture array 121. For example, with respect to the beam profiles shown in FIG. 4A, principal plane 110_2 of condenser lens 110 may be closer to electron source 101 and below pre-beamlet forming mechanism 172, such that the beam current of the on-axis beamlet 102_1, and the off-axis beamlets 102_2 and 102_3, downstream of beam-limit aperture array 121 may be high. The broken-line circles representing PC1 and PC2 are for comparative illustration purposes only.

FIG. 4B illustrates beam profiles of beamlets 102_1, 102_2, and 102_3 having medium beam current, represented as probe current 2 (PC2), as projected on plane 172P. The electrons that constitute the beam profiles PC2 may identify a portion of the electrons of each of the beamlets 102_1, 102_2, and 102_3 that pass through the corresponding aperture of beam-limit aperture array 121, while the remaining electrons of beamlets 102_1, 102_2, and 102_3 may be blocked by beam-limit aperture array 121. The electric current of the beamlet passing through an aperture of pre-beamlet forming mechanism 172 may be based on, for example, the position of principal plane 110_2 of condenser lens 110 along primary optical axis 100_1 and the size of the corresponding aperture of beam-limit aperture array 121. For example, with respect to the beamlet profiles shown in FIG. 4B, principal plane 110_2 of condenser lens 110 is located closer to the center of the distance between pre-beamlet forming mechanism 172 and beam-limit aperture array 121, resulting in medium beam currents of the on-axis beamlet 102_1, and the off-axis beamlets 102_2 and 102_3, exiting beam-limit aperture array 121. In some embodiments, the position of beamlet profile PC2 may be shifted along an axis, for example, x-axis, as the beam current changes as a result of a change in the focal power of condenser lens 110. In some embodiments, position of beamlet profile PC2 may change in multiple axes, for example, x and y axes.

FIG. 4C illustrates beam profiles of beamlets 102_1, 102_2, and 102_3 having low beam current, represented as probe current 1 (PC1), as projected on plane 172P. The electrons that constitute the beam profiles PC1 may identify a portion of the electrons of each of the beamlets 102_1, 102_2, and 102_3 that pass through the corresponding aperture of beam-limit aperture array 121, while the remaining electrons of beamlets 102_1, 102_2, and 102_3 may be blocked by beam-limit aperture array 121. The electric current of the beamlet passing through an aperture of pre-beamlet forming mechanism 172 may be based on, for example, the position of principal plane 110_2 of condenser lens 110 along primary optical axis 100_1 and the size of the corresponding aperture of beam-limit aperture array 121. For example, with respect to the beamlet profiles shown in FIG. 4C, principal plane 110_2 of condenser lens 110 is between pre-beamlet forming mechanism 172 and beam-limit aperture array, but closer to beam-limit aperture array 121, resulting in low beam currents of the on-axis beamlet 102_1, and the off-axis beamlets 102_2 and 102_3, exiting beam-limit aperture array 121. It is appreciated that the position of beamlet profile PC1 may be shifted along an axis, for example, x-axis, as the beam current changes. In some embodiments, position of beamlet profile PC1 may change in multiple axes, for example, x and y axes.

Figure 5A:
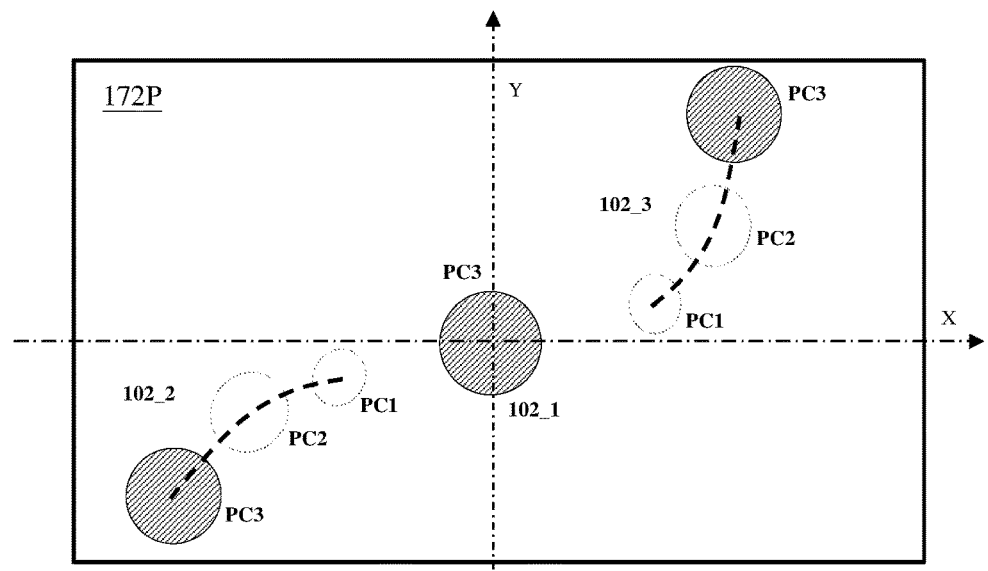
FIGS. 5A-5C are schematic diagrams illustrating exemplary charged-particle beam profiles of varying probe currents on an aperture array in multi-beam apparatus of FIG. 3, consistent with embodiments of the present disclosure.
Figure 5B:
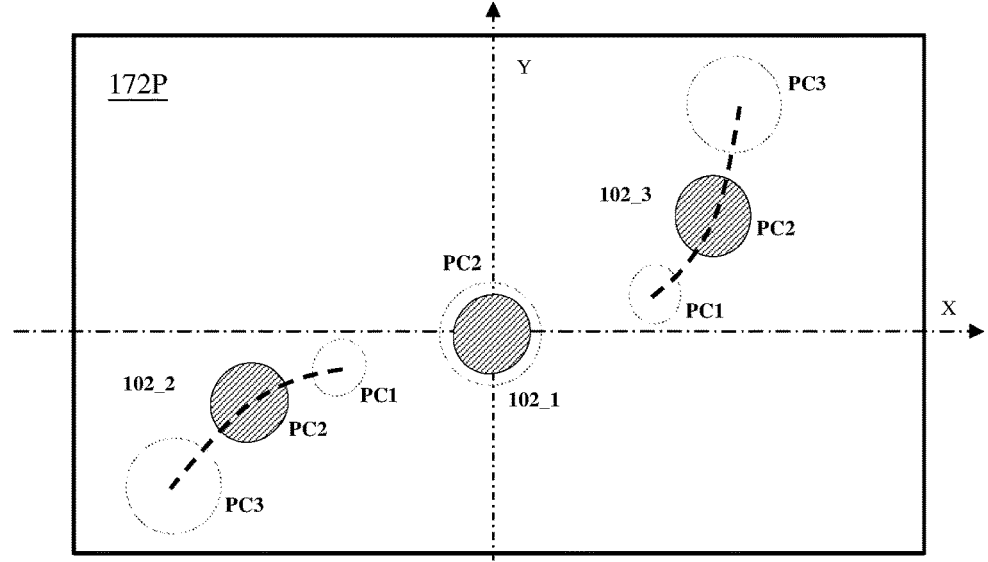
Figure 5C:
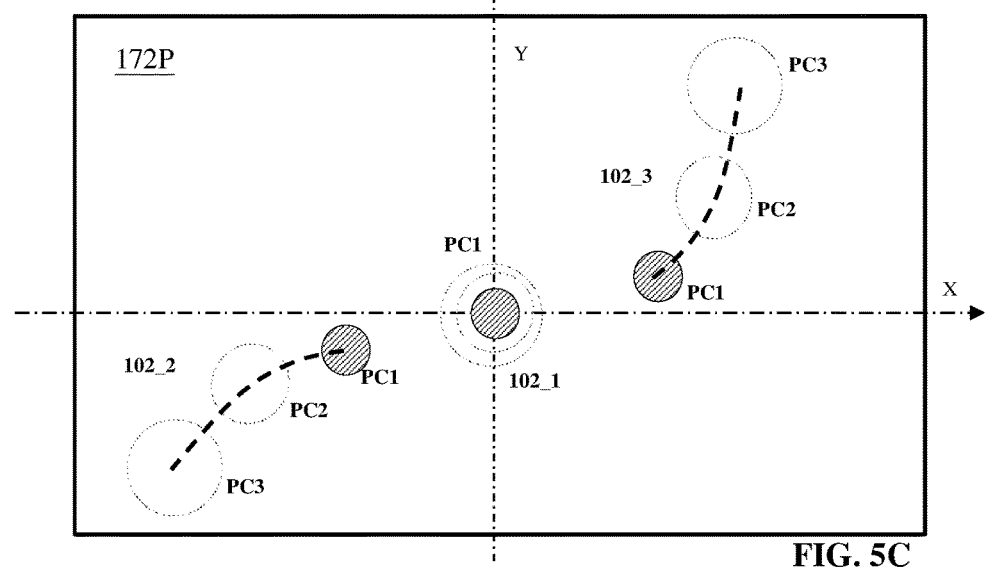

Reference is now made to FIGS. 5A-5C, which illustrate schematic diagrams of exemplary charged-particle beam profiles (e.g., profiles of electron beams) of varying probe currents, as projected on plane 172P, consistent with embodiments of the present disclosure. FIGS. 5A-5C illustrate projected beam profiles of beamlets 102_1, 102_2, and 102_3 exiting beam-limit aperture array 121 in a configuration comprising an adjustable electromagnetic condenser lens, which may cause off-axis beamlets 102_2 and 102_3 to illuminate beam-limit aperture array 121 with rotation angles. The rotation angles may change with the focusing power or the position of principal plane 110_2 of the adjustable condenser lens 110 along primary optical axis 100_1. The projected beam profiles on plane 172P of pre-beamlet forming mechanism 172 are virtual projections demonstrated for illustrative purposes only.

FIGS. 5A-5C illustrate profiles of beamlets 102_1, 102_2, and 102_3 having varying beam currents, represented as PC1, PC2, and PC3. The electric current of the beamlet passing through an aperture of pre-beamlet forming mechanism 172 may be based on, for example, the position of principal plane 110_2 of condenser lens 110 along primary optical axis 100_1 and the size of the corresponding aperture of beam-limit aperture array 121.

In comparing the beamlet profiles PC3 of FIG. 5A with the beamlet profiles PC2 and PC1 of FIGS. 5B & 5C, respectively, beamlet profiles PC3 appear larger based on the relative positioning of condenser lens 110, electron source 101, and pre-beamlet forming mechanism 172. For instance, when principal plane 110_2 of condenser lens 110 is located closer to electron source 101 and below pre-beamlet forming mechanism 172, the beamlet profile PC3 may appear larger than when principal plane 110_2 of condenser lens 110 is located farther from electron source 101 and closer to beam-limit aperture array 121.

With reference to FIG. 5B, principal plane 110_2 of condenser lens 110 may be located closer to the center of the distance between pre-beamlet forming mechanism 172 and beam-limit aperture array 121, resulting in an on-axis beamlet 102_1, and the off-axis beamlets 102_2 and 102_3 exiting beam-limit aperture array 121, having medium beam currents. The profiles of beams having medium beam currents are represented by PC2.

With reference to FIG. 5C, principal plane 110_2 of condenser lens 110 may be located closer to beam-limit aperture array 121, resulting in smaller beam currents of the on-axis beamlet 102_1, and the off-axis beamlets 102_2 and 102_3, exiting beam-limit aperture array 121. The projections of beams having small beam currents are represented by PC1.

In some embodiments, in multi-beam apparatus 300 comprising an electromagnetic compound adjustable condenser lens, the position of beamlet profiles PC1, PC2, or PC3 may vary along both axes, for example, x-axis and y-axis, such that the positions may be traced along a curved path, as illustrated in FIGS. 5A-5C. As used herein, a position of a beamlet may be referred to as the position of the center axis of the beamlet.

Figure 6A:
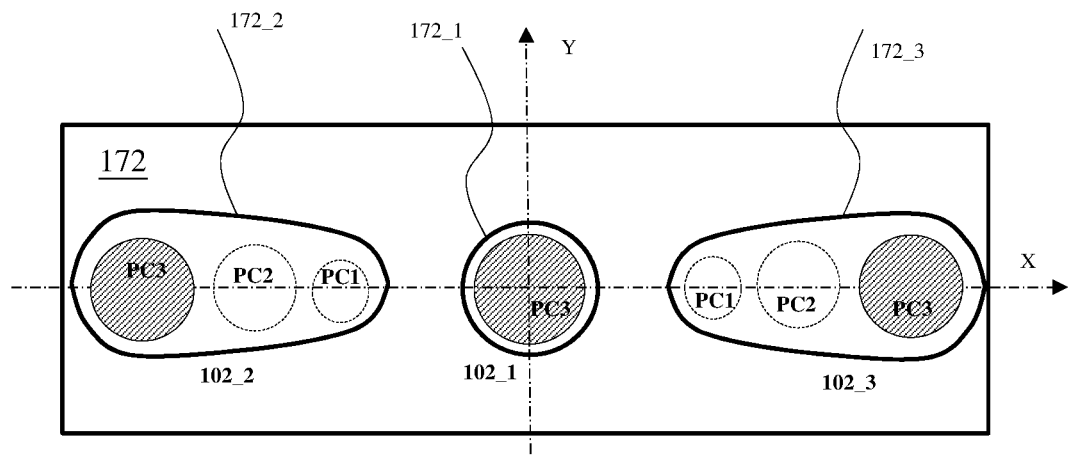
FIGS. 6A and 6B are schematic diagrams illustrating exemplary arrangement of elongated apertures of an aperture array, consistent with embodiments of the present disclosure.
Figure 6B:
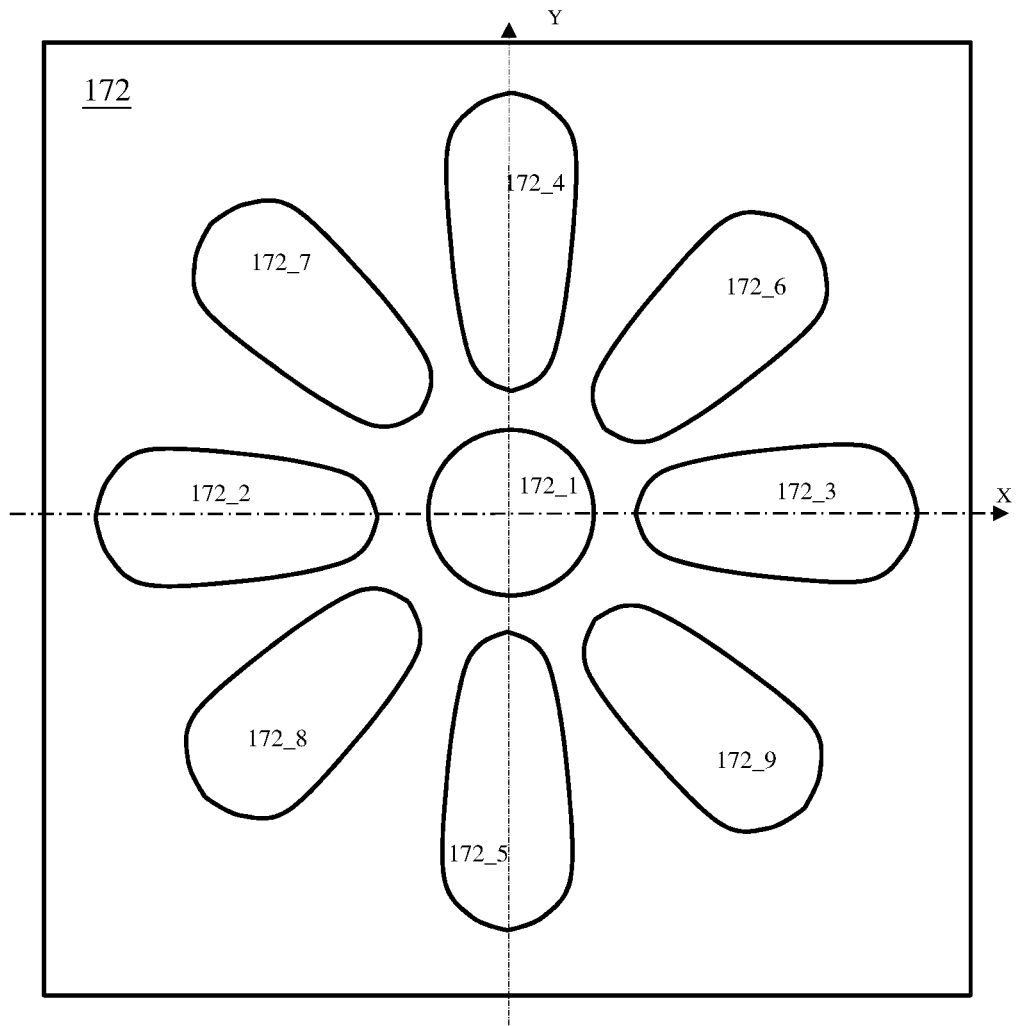

Reference is now made to FIGS. 6A and 6B, which illustrate schematics of exemplary arrangements of apertures of pre-beamlet forming mechanism 172, consistent with embodiments of the present disclosure. In some embodiments, as illustrated in FIG. 6A, pre-beamlet forming mechanism 172 may comprise an on-axis aperture 172_1, and off-axis apertures such as 172_2 and 172_3. On-axis aperture 172_1 may be configured to generate on-axis beamlet 102_1 from primary charged-particle beam 102. In some embodiments, on-axis aperture 172_1 may be large enough to allow beamlets of varying sizes such as PC1, or PC2, or PC3, to pass through. In some embodiments, the geometric center of on-axis aperture 172_1 may be aligned with primary optical axis 100_1. On-axis aperture 172_1 may have a circular, an elliptical, a substantially circular cross-section, or other appropriate cross-sections.

Off-axis apertures 172_2 and 172_3 may be configured to generate off-axis beamlets 102_2 and 102_3, respectively. As illustrated in FIG. 6A, off-axis apertures 172_2 and 172_3 may be configured to allow passage of beamlets having high probe current while maintaining a small overall aperture size to minimize the Coulomb effect. For example, one or more off-axis apertures (e.g., apertures 172_2 and 172_3) may be elliptical and tapering along the major axis, or conical frustum with rounded ends, or other appropriate shapes. In some embodiments, off-axis apertures may be symmetrical along an axis, or asymmetrical.

In some embodiments, off-axis beamlet 102_2 exiting pre-beamlet forming mechanism 172 may have a shape substantially similar to the shape of off-axis aperture 172_2. The profile of a beamlet exiting an aperture of beam-limit aperture array 121 may be represented as PC1, PC2 or PC3, based on the position of condenser lens 110 and size of the apertures of beam-limit aperture array 121. The cross-section of off-axis beamlets exiting beam-limit aperture array 121 such as, off-axis beamlets 102_2 and 102_3, may be circular or substantially circular.

In some embodiments, as illustrated in FIG. 6B, pre-beamlet forming mechanism 172 may comprise an on-axis aperture 172_1 and eight off-axis apertures such as 172_2, 172_3, 172_4, 172_5, 172_6, 172_7, 172_8, and 172_9, configured to generate nine beamlets from primary electron beam 102. The off-axis apertures may be arranged symmetrically around on-axis aperture 172_1, or asymmetrically. Each off-axis aperture may be uniform in shape, size, or cross-section. In some embodiments, off-axis apertures may be non-uniform in shape, size, or cross-section. While FIG. 6B illustrates nine apertures, it is appreciated that there may be any number of apertures and corresponding beamlets, as desired.

Figure 7A:
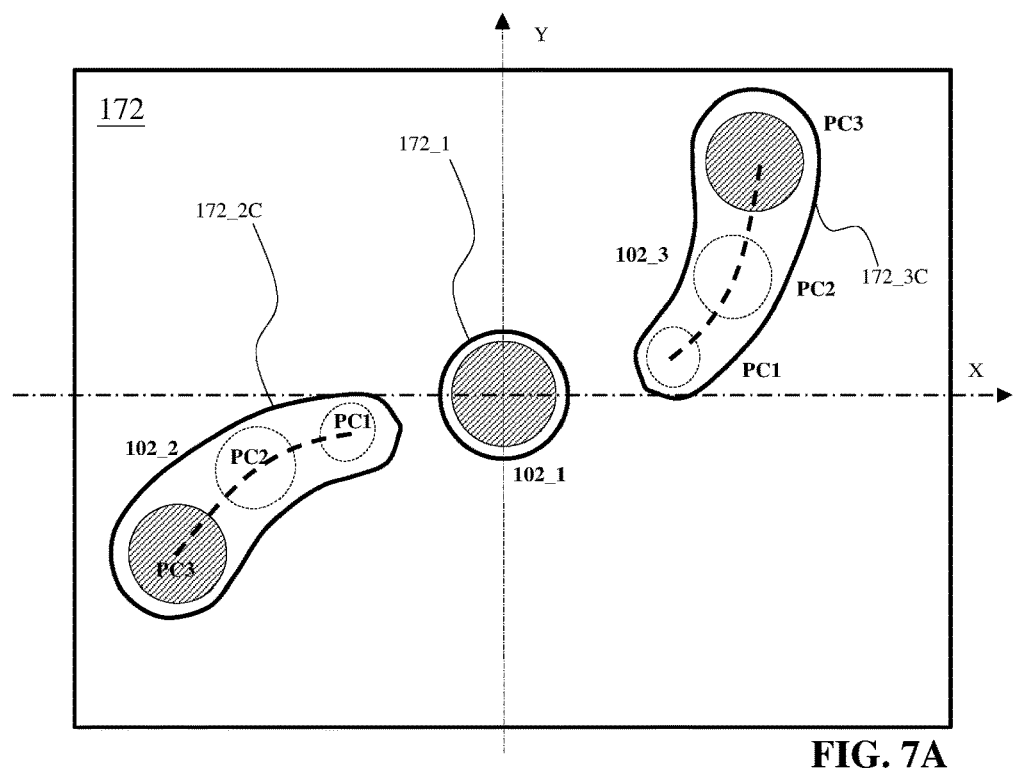
FIGS. 7A and 7B are schematic diagrams illustrating exemplary curved apertures of an aperture array, consistent with embodiments of the present disclosure.
Figure 7B:
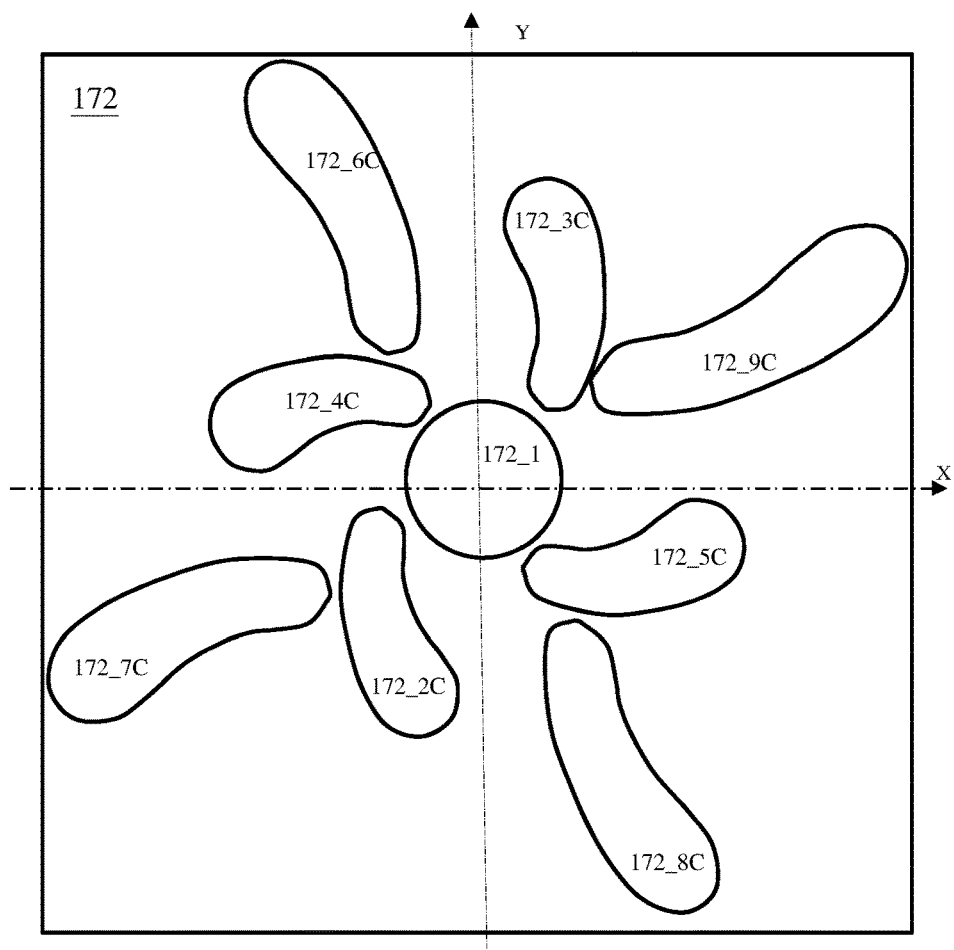

Reference is now made to FIGS. 7A and 7B, which illustrate schematics of exemplary arrangements of apertures of pre-beamlet forming mechanism 172, consistent with embodiments of the present disclosure. In some embodiments, as illustrated in FIG. 7A, pre-beamlet forming mechanism 172 may comprise an on-axis aperture 172_1, and off-axis apertures such as 172_2C and 172_3C. The off-axis apertures (e.g., 172_2C and 172_3C) may be curved elliptical and may taper as the aperture approaches the origin of x-y coordinates, where primary optical axis 100_1 passes through the x-y plane substantially at the origin. In some embodiments, the orientation of off-axis apertures 172_2C and 172_3C may be based on the rotation angle of the beamlets when passing through the electromagnetic condenser lens and the position of apertures of beam-limit aperture array 121. In some embodiments, rotation of the beamlets may vary based on the electrical excitation of the condenser lens.

In some embodiments, as illustrated in FIG. 7B, pre-beamlet forming mechanism 172 may comprise an on-axis aperture 172_1 and eight off-axis apertures, such as apertures 172_2C, 172_3C, 172_4C, 172_5C, 172_6C, 172_7C, 172_8C, and 172_9C, configured to generate nine beamlets from primary electron beam 102. Off-axis apertures may be arranged such that there is no overlap between adjacent apertures. In some embodiments, off-axis apertures may be uniform in shape, size, orientation, or cross-section. In some embodiments, apertures may be non-uniform in shape, size, orientation, or cross-section.

In some embodiments, the Coulomb effect in the region between pre-beamlet forming mechanism 172 and beam-limit aperture array 121 may depend on the size of the beamlet generated by apertures of pre-beamlet forming mechanism 172. For example, off-axis beamlets (e.g., 102_2 and 102_3 of FIG. 6A) may have a larger Coulomb effect compared to the on-axis beamlet (e.g., 102_1 of FIG. 6A), because the overall area of non-circular off-axis aperture (e.g., 172_2 or 172_3 of FIG. 6A) is larger than the overall area of circular on-axis aperture 172_1. The difference in Coulomb effect between on-axis and off-axis beamlets may result in a difference in resolution within an image. For example, regions of the image corresponding to the probe spots formed by off-axis beamlets 102_2 and 102_3 may have inferior resolution than the regions of the image corresponding to the probe spot formed by on-axis beamlet 102_1. The difference in resolution within an image may not be desired because it may affect the user's ability to analyze and detect defects reliably.

Figure 8A:
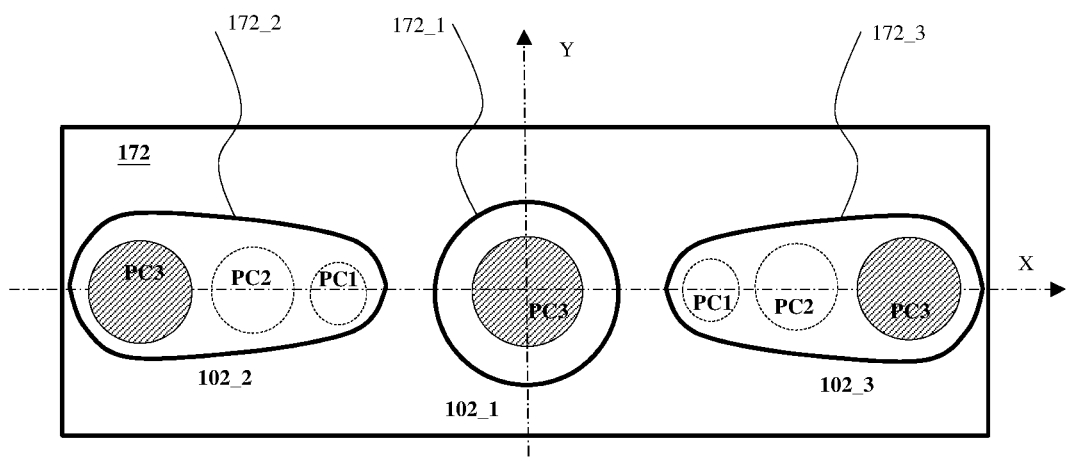
FIGS. 8A and 8B are schematic diagrams illustrating exemplary arrangements of apertures of an aperture array in a multi-beam apparatus, consistent with embodiments of the present disclosure.
Figure 8B:
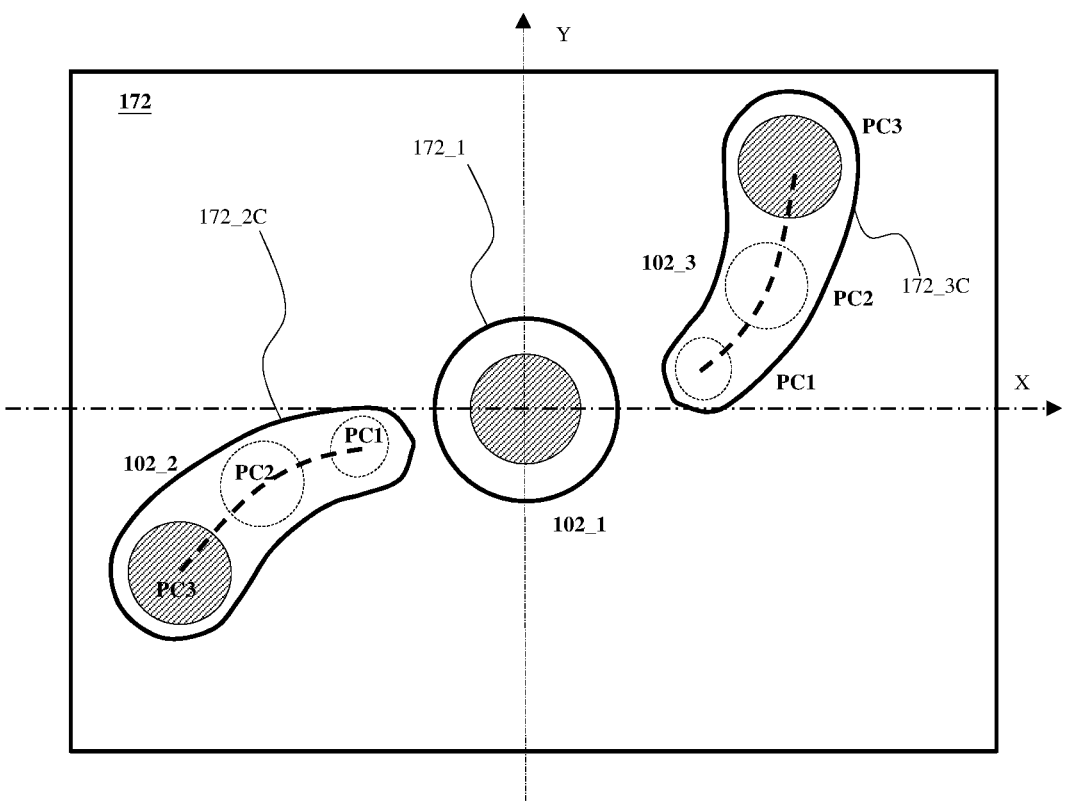

Reference is now made to FIGS. 8A and 8B, which illustrate schematics of exemplary arrangements of apertures of pre-beamlet forming mechanism 172 in multi-beam apparatus 300, consistent with embodiments of the present disclosure. FIG. 8A illustrates an arrangement of three apertures in multi-beam apparatus 300 comprising an adjustable anti-rotation electrostatic condenser lens (e.g., condenser lens 110 of FIG. 3), in which the rotation angles do not change when the focusing power and the position of principal plane 110_2 of condenser lens 110 are varied. FIG. 8B illustrates an arrangement of three apertures in multi-beam apparatus 300 comprising an adjustable electromagnetic condenser lens, which may cause off-axis beamlets 102_2 and 102_3 to illuminate beam-limit aperture array 121 with rotation angles. The rotation angles may change with the focusing power or the position of principal plane (e.g., principal plane 110_2 of FIG. 3) of the adjustable condenser lens 110 along primary optical axis 100_1.

As illustrated in FIGS. 8A and 8B, the size of on-axis aperture 172_1 may be enlarged such that the difference in overall areas of on-axis aperture 172_1 and off-axis apertures (e.g., 172_2 and 172_3) is reduced, thus minimizing the difference in resolution within the image generated by probe spots (e.g., probe spots 102_1S, 102_2S, and 102_3S of FIG. 3). Although FIGS. 8A and 8B illustrate circular on-axis apertures 172_1, other cross-sections including, but not limited to, elliptical, polygonal, triangular, or any non-circular cross-sections may be used. In some embodiments, the shape and size of on-axis aperture 172_1 may be similar to off-axis apertures (e.g., off-axis aperture 172_2 of FIG. 8A or off-axis aperture 172_2C of FIG. 8B).

Figure 9:
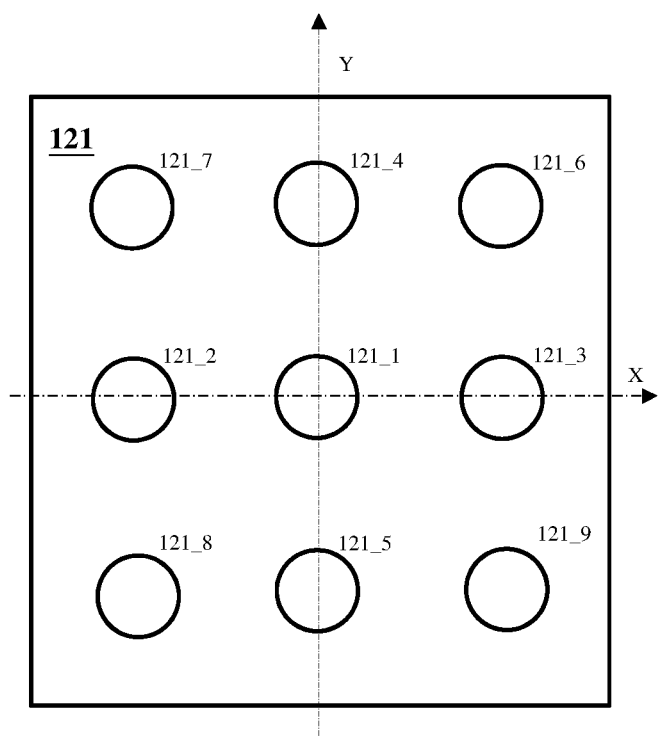
FIG. 9 is a schematic diagram illustrating an exemplary arrangement of apertures of beam-limit aperture array in multi-beam apparatus of FIG. 3, consistent with embodiments of the present disclosure.

Reference is now made to FIG. 9, which illustrates an exemplary arrangement of apertures in beam-limit aperture array 121, consistent with embodiments of the present disclosure. Although FIG. 9 illustrates nine apertures, beam-limit aperture array 121 may comprise any number of apertures. In some embodiments, beam-limit aperture array 121 may comprise apertures arranged in a regular fashion, for example, a pattern having a rectangular, a circular, a spiral, a polygonal shape, or the like. In some embodiments, apertures of beam-limit aperture array 121 may be uniform in shape, size, cross-section, or pitch, or any combinations thereof. As used herein, pitch of an array with circular apertures may be referred to as the distance between the centers of two immediately adjacent apertures. In some embodiments, apertures of beam-limit aperture array 121 may be randomly arranged and may be non-uniform in shape, size, cross-section, or pitch, or any combinations thereof.

In some embodiments, the number of apertures of beam-limit aperture array 121 may determine the number of beamlets incident on the sample surface and generating probe spots. In some embodiments, the number of apertures in beam-limit aperture array 121 may be equal to, less than, or more than the number of apertures of pre-beamlet forming mechanism 172.

In some embodiments, beam-limit aperture array 121 may be located below condenser lens 110, as illustrated in FIG. 3. Condenser lens 110 may be configured to collimate beamlets 102_1, 102_2, and 102_3 such that they are substantially parallel to primary optical axis 100_1 and normally incident on beam-limit aperture array 121. In some embodiments, condenser lens 110 may collimate beamlets generated by apertures 172_1-172_9 of pre-beamlet forming mechanism 172 of FIG. 7B such that the beamlets are substantially parallel to primary optical axis 100_1 and normally incident on beam limit aperture array 121 of FIG. 9. The size of apertures of beam-limit aperture array 121 may determine the size of the beamlet exiting source conversion unit 120, and eventually the size of the probe spot generated on surface of sample 190.

Figure 10:
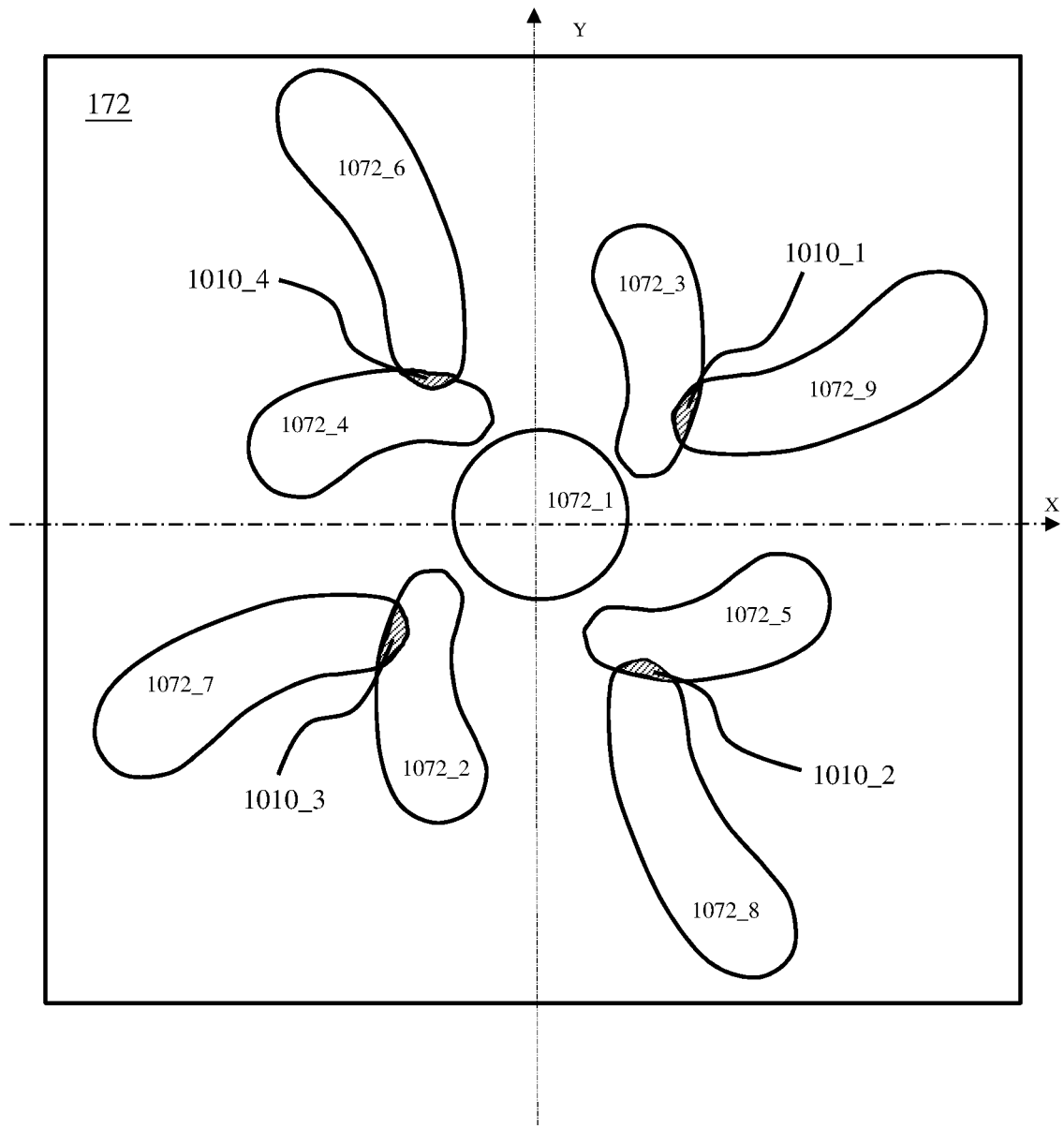
FIG. 10 is a schematic diagram illustrating an exemplary projection of partially overlapping apertures of an aperture array in a multi-beam apparatus, consistent with embodiments of the present disclosure.

Reference is now made to FIG. 10, which illustrates an exemplary outline of apertures of pre-beamlet forming mechanism 172 in multi-beam apparatus 300 comprising an electromagnetic compound condenser lens and beam-limit aperture array 121, consistent with embodiments of the present disclosure. In some embodiments, the pitch of apertures of beam-limit aperture array 121 may be too small such that the corresponding off-axis apertures of pre-beamlet forming mechanism 172 may comprise partially overlapping regions 1010_1, 1010_2, 1010_3, and 1010_4, as illustrated in FIG. 10. For example, off-axis apertures 1072_3 and 1072_9 may comprise overlapping region 1010_1, off-axis apertures 1072_5 and 1072_8 may comprise overlapping region 1010_2, off-axis apertures 1072_2 and 1072_7 may comprise overlapping region 1010_3, and off-axis apertures 1072_4 and 1072_6 may comprise overlapping region 1010_4. In some embodiments, overlapping regions may be uniform in shape and size, or non-uniform in shape and size.

In some embodiments, an overlap in aperture profiles of pre-beamlet forming mechanism 172 may be caused due to large variations in probe current based on a combination of the position of condenser lens 110 and aperture size of beam-limit aperture array 121. For example, if condenser lens is positioned closer to beam-limit aperture array 121 comprising apertures with a small pitch, corresponding apertures of pre-beamlet forming mechanism 172 may partially overlap (e.g., overlapping region 1010_1).

Figure 11A:
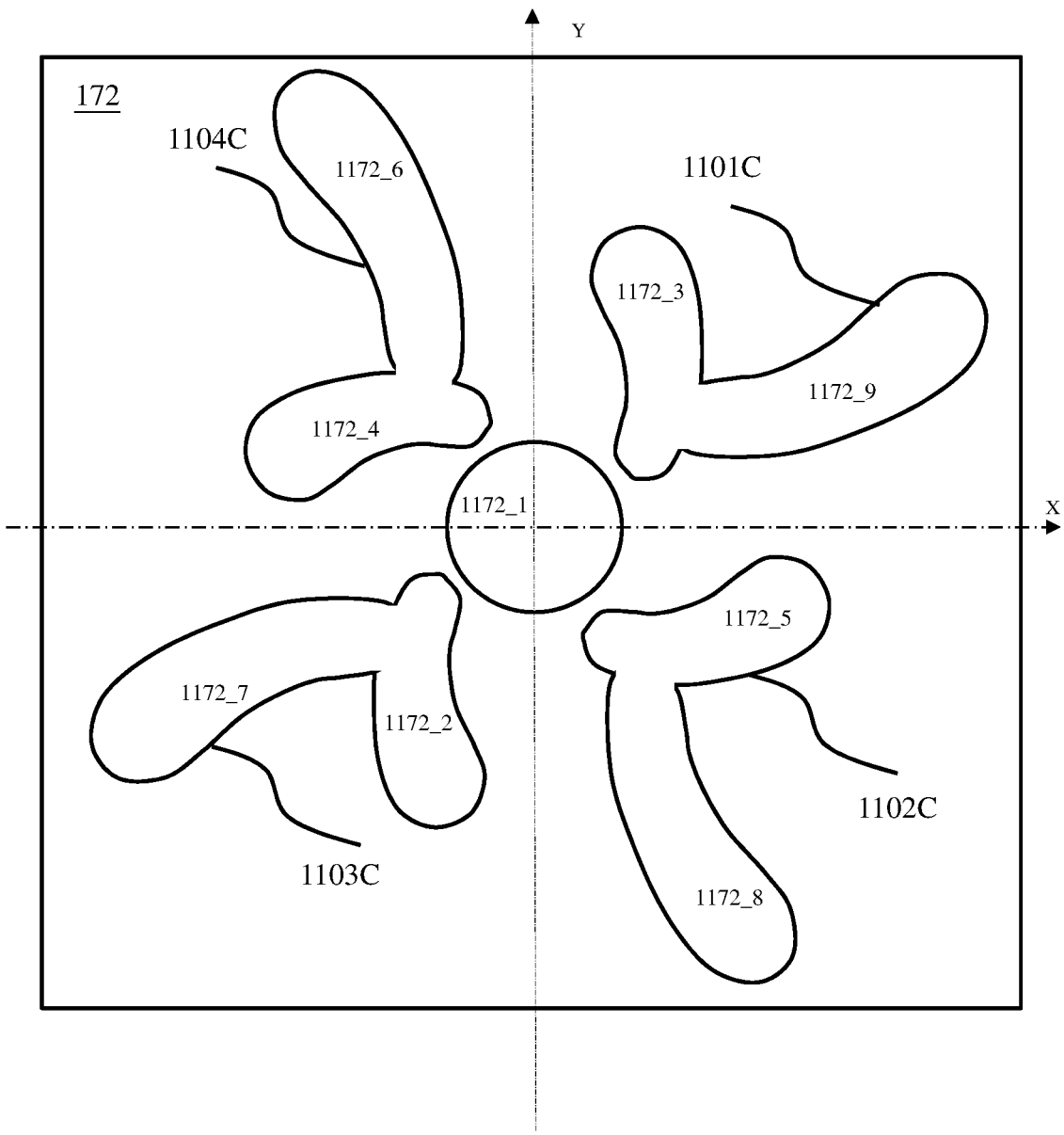
FIG. 11A is a schematic diagram illustrating an exemplary arrangement of merged apertures of an aperture array of FIG. 10, consistent with embodiments of the present disclosure.

Reference is now made to FIG. 11A, which illustrates an exemplary arrangement of partially overlapping apertures of pre-beamlet forming mechanism 172, consistent with embodiments of the present disclosure. Pre-beamlet forming mechanism 172 of FIG. 11A may comprise an on-axis aperture 1172_1 and four off-axis merged apertures 1101C, 1102C, 1103C, and 1104C. In some embodiments, apertures of pre-beamlet forming mechanism 172 comprising overlapping regions 1010 of FIG. 10 may be merged to form off-axis merged apertures 1101C, 1102C, 1103C, and 1104C. For example, off-axis apertures 1172_3 and 1172_9 may be merged to form off-axis merged aperture 1101C, off-axis apertures 1172_5 and 1172_8 may be merged to form off-axis merged aperture 1102C, off-axis apertures 1172_2 and 1172_7 may be merged to form off-axis merged aperture 1103C, and off-axis apertures 1172_4 and 1172_6 may be merged to form off-axis merged aperture 1104C.

In some embodiments, the size of on-axis aperture 1172_1 of FIG. 11A may be adjusted accordingly to reduce the difference between the overall area of an off-axis merged aperture such as, for example, 1101C and on-axis aperture 1172_1, thus minimizing the difference in resolution within an image due to varied Coulomb effect, as discussed with regard to FIGS. 8A and 8B.

Figure 11B:
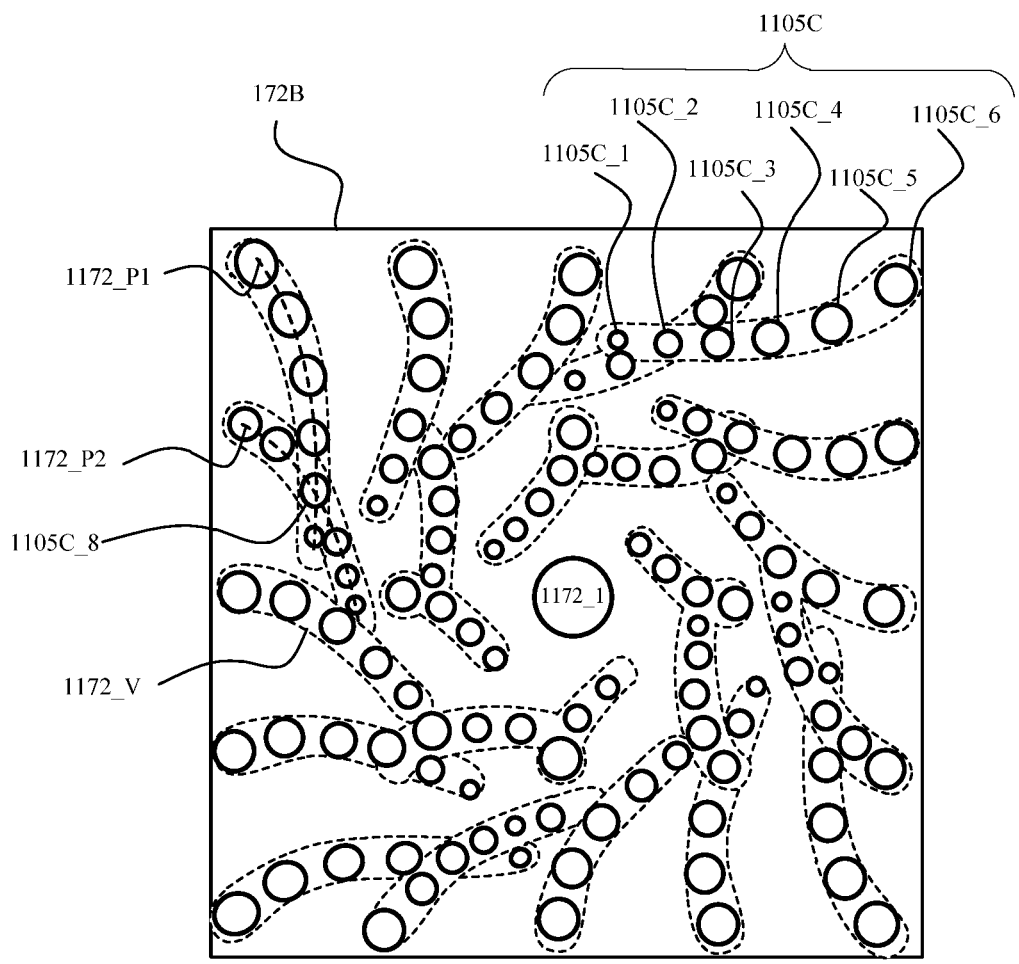
FIG. 11B illustrates an exemplary arrangement of apertures of an aperture array of FIG. 10, consistent with embodiments of the present disclosure.

Reference is now made to FIG. 11B, which illustrates an exemplary arrangement of apertures of pre-beamlet forming mechanism 172B, consistent with embodiments of the present disclosure. Pre-beamlet forming mechanism 172B of FIG. 11B may comprise an on-axis aperture 1172_1 and at least one set of off-axis apertures 1105C. As shown in FIG. 11B, in some embodiments, pre-beamlet forming mechanism 172B may comprise multiple sets of off-axis apertures 1105C.

In some embodiments, pre-beamlet forming mechanism 172B may comprise a planar structure having a plurality of apertures. The planar structure may be made from a material comprising a metal, an alloy, a composite material, a semiconductor, or the like. In some embodiments, the material may be an electrical conductor or coated with an electrically conducting material. The apertures of pre-beamlet forming mechanism 172B may be formed using techniques including, but not limited to, mechanical machining, micro-electromechanical systems (MEMS) fabrication techniques, chemical etching, laser cutting, etc.

In some embodiments, pre-beamlet forming mechanism 172B may be aligned such that the geometric center of on-axis aperture 1172_1 coincides with primary optical axis 100_1. On-axis aperture 1172_1 may be circular or substantially circular in cross-section. In some embodiments, at least a portion of on-axis primary beamlet formed by on-axis aperture 1172_1 may be incident on an on-axis aperture of beam limit aperture array 121. In some embodiments, the size of on-axis aperture 1172_1 may be configured to be larger than or substantially similar to the size of the corresponding on-axis aperture of beam limit aperture array 121. In some embodiments, size of the on-axis aperture of beam limit aperture array 121 may determine the size of the probing beamlet exiting beam limit aperture array 121.

In multibeam SEMs, it may be desirable to generate multiple beams having a large current range to allow the tool to be used for low resolution imaging as well as high resolution imaging. Although large and continuous current ranges may be accomplished by increasing the size of the apertures, however, large apertures may negatively impact the mechanical and structural integrity of the structure (e.g., aperture arrays) and increase Coulomb interaction effects, among other issues. It may be desirable to fabricate aperture arrays that enable generating multiple beams and large current ranges while maintaining the mechanical and structural integrity.

In some embodiments, pre-beamlet forming mechanism 172B may comprise a set of off-axis apertures 1105C including exemplary off-axis apertures 1105C_1, 1105C_2, 1105C_3, 1105C_4, 1105C_5, and 1105C_6. The apertures of the set of off-axis apertures 1105C may enable generation of beamlets having discrete current ranges compared to a continuous current range provided by a large aperture of comparable size. Although the set of off-axis apertures 1105C is shown to include six off-axis apertures, it is appreciated that there may be any number of off-axis apertures, as appropriate.

Pre-beamlet forming mechanism 172B, as shown in FIG. 11B, may be used in an apparatus configured to generate a 5×5 array of probing beamlets. In some embodiments, each set of off-axis apertures 1105C and on-axis aperture 1172_1 may be associated with a corresponding aperture of beam limit aperture array 121 of FIG. 3. For example, based on the association, the number of sets of off-axis apertures of pre-beamlet forming mechanism 172B may be equal to the number of off-axis apertures of beam limit aperture array 121. The number of probing beamlets to be generated, and therefore, the number of apertures, including sets of off-axis apertures 1105C and on-axis aperture of pre-beamlet forming mechanism 172B, may be determined based on the application, and the number of discrete current settings desired. For example, a 7×7 array of apertures may be used in applications where a larger current range of the probing beamlets is desired, or a 3×3 array of apertures may be used in applications or tools with spatial limitations.

Pre-beamlet forming mechanism 172B in a multibeam apparatus (e.g., EBI system 100 of FIG. 1) may have some or all of the advantages discussed herein, among others.

i. Large beam current range—A large range of beam currents may be desired to perform multiple operations or functions by a multibeam SEM. The range of beam currents may be expanded by providing apertures of various sizes within a set of off-axis apertures, as illustrated in FIG. 11B, while reducing Coulomb interaction effects.

ii. Enhanced structural integrity—The apertures within a set of off-axis apertures may be separated by the material of pre-beamlet forming mechanism 172B, thus maintaining the mechanical rigidity of the structure while increasing the range of beam currents for inspecting a sample.

iii. Reduced Coulomb interaction effects—Coulomb interaction is a function of the transmission area of an aperture array, and therefore increases for a system with large apertures. Apertures of the set of off-axis apertures enable generating a large range of beam currents while reducing the transmission area of electrons, thereby reducing the Coulomb interaction effects and resultantly enhancing imaging resolution.

iv. Manufacturability—Fabricating apertures in an aperture array such as pre-beamlet forming mechanism 172 may include removing of material to form a path for the electrons to pass through. While larger apertures increase the continuous current range, they may negatively affect the manufacturability of the arrays due to inadequate support material remaining after apertures are formed. Pre-beamlet forming mechanism 172B may be easily and reliably manufacturable because apertures within a set of off-axis apertures are separated by the material of which the pre-beamlet forming mechanism 172B is made.

In some embodiments, off-axis apertures (e.g., 1105C_1, 1105C_2, 1105C_3, 1105C_4, 1105C_5, and 1105C_6) of set of off-axis apertures 1105C may be different in size. As illustrated in FIG. 11B, the radii of circular off-axis apertures may be different. For example, the radius of aperture 1105C_1 may be smaller than the radius of 1105C_2, the radius of aperture 1105C_2 may be smaller than the radius of aperture 1105C_3, the radius of aperture 1105C_3 may be smaller than the radius of aperture 1105C_4, the radius of aperture 1105C_4 may be smaller than the radius of aperture 1105C_5, and the radius of aperture 1105C_5 may be smaller than the radius of aperture 1105C_6. In some embodiments, at least two off-axis apertures of the set of off-axis apertures may be different in size. The size of an off-axis aperture may determine the current of the primary beamlet generated from the off-axis aperture, and apertures of different sizes may allow generating beamlets having a larger current range. In some embodiments, the off-axis apertures of the set of off-axis apertures 1105C may be smaller than, equal to, or larger than the corresponding off-axis aperture of beam limit aperture array 121.

In some embodiments, a cross-section of the apertures of the set of off-axis apertures 1105C may be circular, rectangular, substantially circular, elliptical, or polygonal, or the like. The cross-section of the apertures may determine the cross-section and shape of the primary beamlets generated thereby. In some embodiments, the set of off-axis apertures 1105C may comprise apertures having different cross-sections. For example, apertures 1105C_1 and 1105C_3 may be circular, and apertures 1105C_2 and 1105C_4 may be elliptical.

In some embodiments, a pitch of apertures of the set of off-axis apertures 1105C may be uniform. In the context of this disclosure, and in the case of circular apertures, as shown in FIG. 11B, a pitch may be defined as the shortest distance between the geometric centers of immediately adjacent apertures. In some embodiments, the pitch of apertures of the set of off-axis apertures 1105C may be non-uniform.

In some embodiments, apertures of the set of off-axis apertures 1105C may be disposed along a curved path, as indicated by a virtual path (e.g., paths 1172_P1 and 1172_P2 of FIG. 11B). The dashed lines indicating virtual paths 1172_P1 and 1172_P2 are for illustrative purposes only. It is appreciated that the radii of curvature of the path along which apertures of a set of off-axis apertures are disposed may vary between sets of off-axis apertures. It is also appreciated that apertures of a set of off-axis apertures (e.g., 1105C of FIG. 11B) may be disposed along multiple paths having different radii of curvature. In some embodiments, apertures of the set of off-axis apertures 1105C may be disposed along a straight path. In some embodiments, the path along which apertures of the set of off-axis apertures 1105C are disposed may be based on characteristics of condenser lens 110.

In some embodiments, a set of off-axis apertures may intersect with an adjacent set of off-axis apertures such that an aperture may correspond to more than one set of off-axis apertures. For example, aperture 1105C_8 may correspond to a set of off-axis apertures along path 1172_P1 and to a set of off-axis apertures along path 1172_P2. In some embodiments, a set of off-axis apertures may intersect with one or more sets of off-axis apertures. In some embodiments, an aperture of a set of off-axis apertures may be placed immediately adjacent to an aperture of an intersecting set of off-axis apertures such that at least a portion of the apertures overlap with each other.

It should be noted that the curved and tapered ellipses 1172_V indicating the boundaries within which the apertures of set of off-axis apertures 1105C may be disposed, are merely a visual aid for illustrative purposes.

In some embodiments, each aperture of the set of off-axis apertures 1105C may generate a primary beamlet incident on condenser lens 110 disposed downstream of pre-beamlet forming mechanism 172B. In some embodiments, condenser lens 110 may comprise an adjustable electromagnetic lens configured to cause a primary beamlet to form a corresponding probing beamlet of the plurality of probing beamlets exiting beam limit aperture array 121. Based on the settings of condenser lens 110, a primary beamlet formed by an aperture of the set of off-axis apertures 1105C may be incident on the corresponding aperture of beam limit aperture array 121 with rotation angles. The rotation angles may change with the focusing power or the position of principal plane 110_2 of the adjustable condenser lens 110 along primary optical axis 100_1. For example, if condenser lens 110 is positioned closer to electron source 101, the probing beamlet generated from aperture 1105C_6 may be incident on the corresponding off-axis aperture of beam limit aperture array 121. If the size of the corresponding off-axis aperture of beam limit aperture array 121 is larger than the size of aperture 1105C_6, then the probe current of the probing beamlet exiting the corresponding aperture of beam limit aperture array 121 may be determined based on the size of aperture 1105C_6 of pre-beamlet forming mechanism 172B. Alternatively, if the size of the corresponding off-axis aperture of beam limit aperture array 121 is smaller than the size of aperture 1105C_6, then the probe current of the probing beamlet exiting the corresponding aperture of beam limit aperture array 121 may be determined based on the size of aperture of beam limit aperture array 121.

In some embodiments, the set of off-axis apertures 1105C may also be referred to as the set of pre-beamlet forming apertures 1105C. The probe current of a corresponding probing beamlet may be determined based on a characteristic of an aperture of the set of pre-beamlet forming apertures 1105C. Each aperture (e.g., apertures 1105C_1-1105_C6) of the set of pre-beamlet forming apertures 1105C may be configured to influence the probe current of the probing beamlet. The characteristics of the apertures of the set of pre-beamlet forming apertures 1105C may include, but are not limited to, a size, shape, or a location, among other arrangement characteristics. The probe current of the probing beamlet may be discretely adjustable based on, for example, the size of the aperture of the set of pre-beamlet forming apertures 1105C forming the primary beamlet.

In some embodiments, an adjustment of the position of condenser lens 110 along primary optical axis 100_1 may affect or influence the probe current of the probing beamlet formed by a corresponding primary beamlet. As an example, condenser lens 110 placed at a first position may cause a first portion of primary electron beam 102 to pass through an aperture of the set of pre-beamlet forming apertures 1105C to form a primary beamlet having a beam current value, and condenser lens 110 placed at a second location, different from the first location, may cause a second portion of primary electron beam 102 to pass through a different aperture of the set of pre-beamlet forming apertures 1105C to form a different primary beamlet having a different beam current value, thus affecting the probe current of the probing beamlet formed from the corresponding primary beamlet.

Figure 11C:
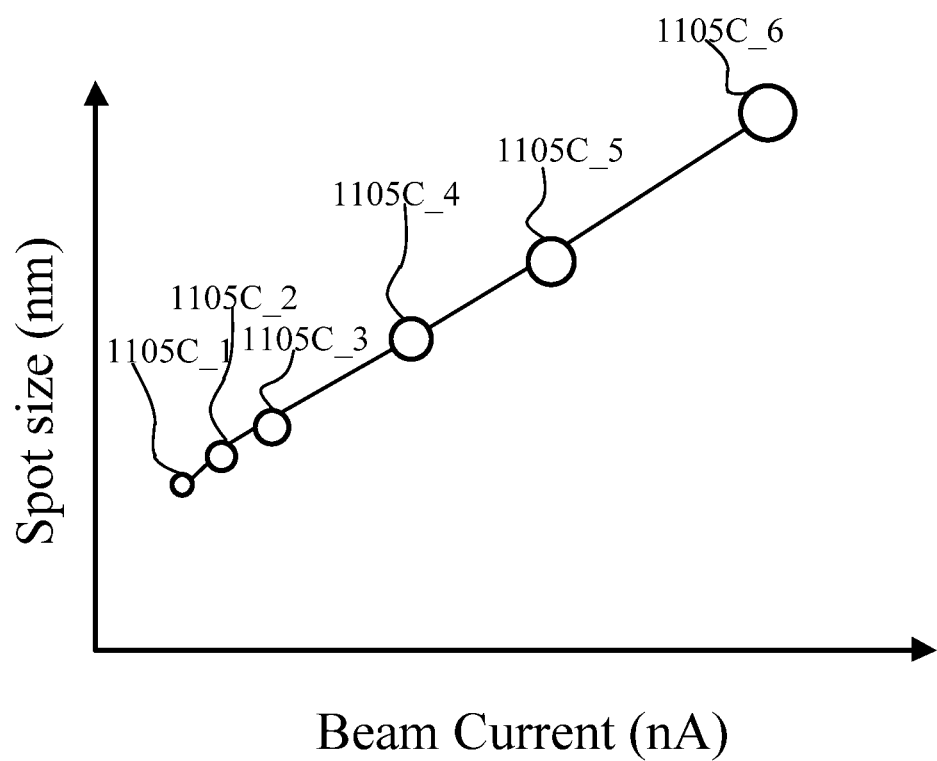
FIG. 11C illustrates a relationship between the spot size and the beam current of a beamlet formed by apertures of FIG. 11B, consistent with embodiments of the present disclosure.

Reference is now made to FIG. 11C, which illustrates a relationship between the probe spot size and the beam current of a beamlet formed by apertures of set of off-axis apertures 1105C. As illustrated, a large aperture (e.g., aperture 1105C_6) may allow more electrons to pass through and therefore, the beamlet formed may have a larger current value and a larger spot size. A small aperture (e.g., aperture 1105C_1 of FIG. 11B) may allow fewer electrons to pass through and therefore, the beamlet formed by aperture 1105C_1 may have a smaller current value and a smaller spot size. A smaller beamlet may have reduced Coulomb interaction effects and resultantly enhanced imaging resolution. In some embodiments where apertures 1105C_1 to 1105C_6 have a same size, the beamlet formed by the apertures may have a different current value for each of the apertures. Further, the current value of a beamlet formed by one aperture may be larger or smaller than the current value of a beamlet formed by an adjacent aperture along a virtual path.

Figure 11D:
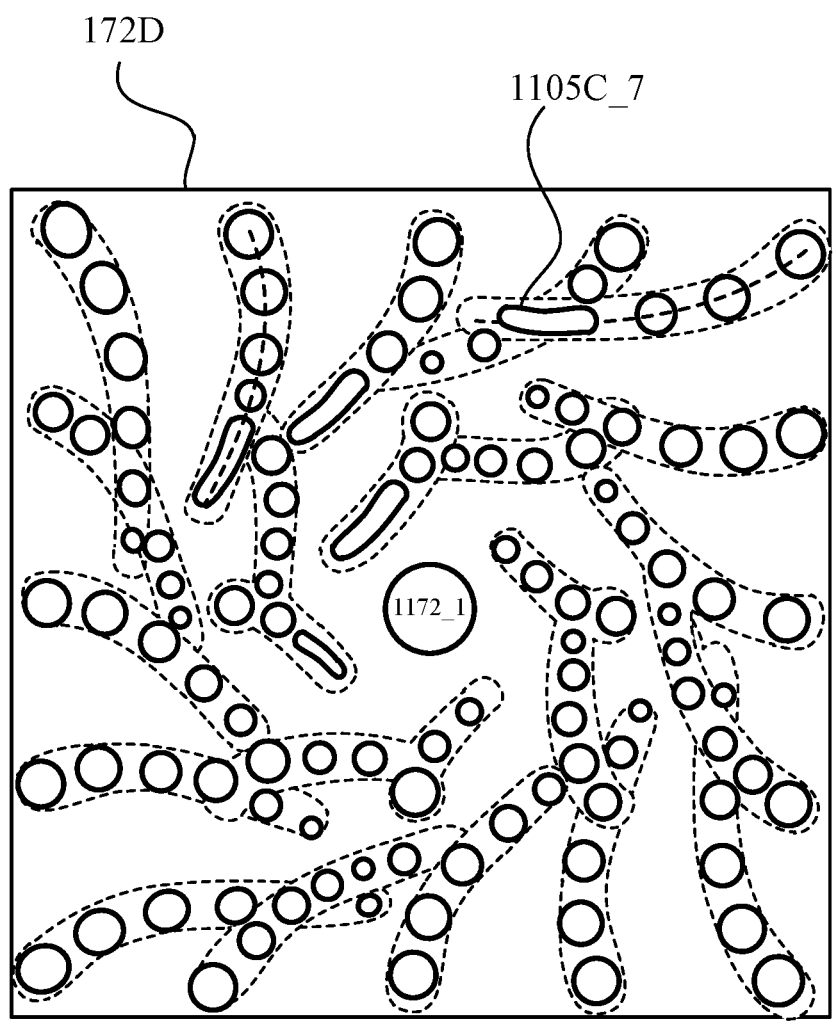
FIG. 11D illustrates an exemplary arrangement of apertures of an aperture array of FIG. 10, consistent with embodiments of the present disclosure.

Reference is now made to FIG. 11D, which illustrates an exemplary arrangement of apertures of pre-beamlet forming mechanism 172D, consistent with embodiments of the present disclosure. In comparison with pre-beamlet forming mechanism 172B of FIG. 11B, set of off-axis apertures 1105C may include at least one non-circular aperture 1105C_7. As shown in FIG. 11D, aperture 1105C_7 may be elliptical in cross-section. Apertures having other cross-sections including, but not limited to, tapered elliptical, curved elliptical, polygonal, etc. may be employed as well.

In some embodiments, aperture 1105C_7 of pre-beamlet forming mechanism 172D may be positioned closer to primary optical axis 100_1 or on-axis aperture 1172_1 such that beam current of the beamlet generated from aperture 1105C_7 is low. The larger aperture 1105C_7 may be useful in providing a continuous current range while maintaining low Coulomb interaction effects because of the low beam current. In some embodiments, one or more sets of off-axis apertures 1105C may comprise aperture 1105C_7.

In multibeam SEMs, it may be desirable to generate multiple beams having a large current range to allow the tool to be used for low resolution imaging as well as high resolution imaging. Although large and continuous current ranges may be accomplished by increasing the size of the apertures, however, large apertures may increase Coulomb interaction effects, among other issues. For high resolution applications, although smaller apertures may produce a smaller probe spot, the Coulomb interaction effects may limit the resolution of the images obtained. Therefore, it may be desirable to fabricate aperture arrays that enable generating multiple beams in broad current ranges while reducing the Coulomb interaction effects and enhancing image resolution.

One of several ways to mitigate the Coulomb interaction effects may include using pre-beamlet forming mechanism 172B comprising an array of active apertures. In the context of this disclosure, an "active aperture" refers to an aperture or an aperture assembly configurable to be electrically activated such that an electric field is created within the aperture or the aperture assembly.

Figure 11E:
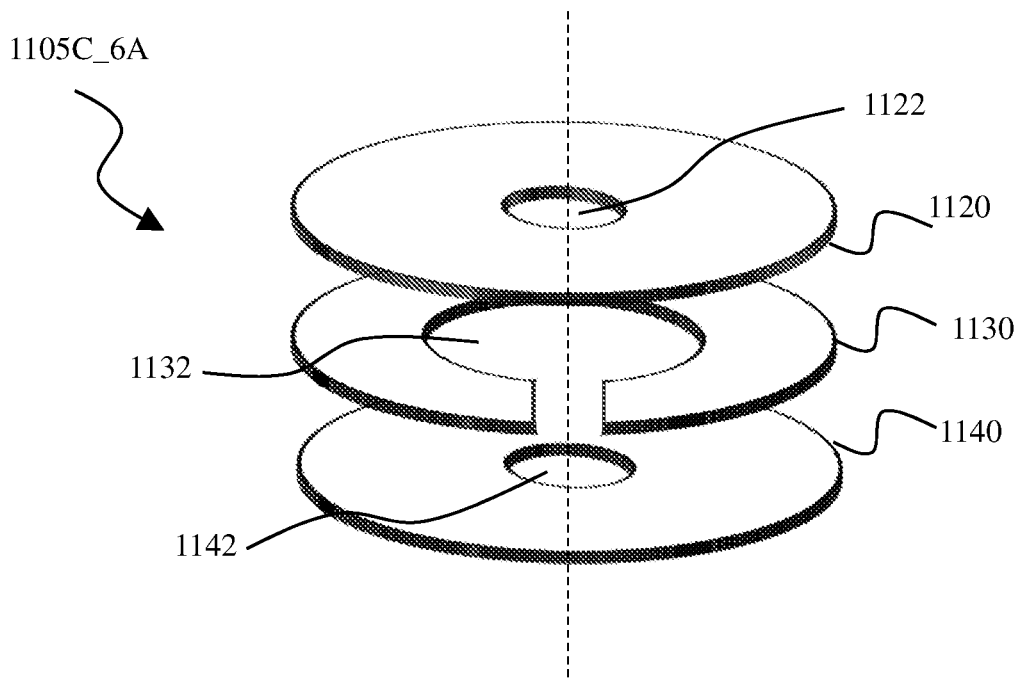
FIG. 11E illustrates an expanded view of an exemplary aperture of an active aperture array, consistent with embodiments of the present disclosure.

Reference is now made to FIG. 11E, which illustrates an expanded view of an exemplary active aperture 1105_C6A comprising a top aperture plate 1120, an active deflector 1130, and a bottom aperture plate 1140. Although active aperture 1105_C6A is shown to include three elements, it is appreciated that there may be more elements such as spacer layers, microlens, as appropriate. In some embodiments, top aperture plate 1120, active deflector 1130, and bottom aperture plate 1140 may be stacked without any spacer layers disposed therebetween. In some embodiments, active aperture 1105_C6A may also be referred to as an active aperture assembly, or an active aperture stack. In some embodiments, active aperture 1105_C6A may not include top aperture plate 1120, while in others active aperture 1105_C6A may not include bottom aperture plate 1142.

In some embodiments, aperture 1105C_6, for example, of pre-beamlet forming mechanism 172B of FIG. 11B may comprise an active aperture. In some embodiments, one or more off-axis apertures of pre-beamlet forming mechanism 172B may comprise an active aperture, or one or more sets of off-axis apertures, such as, for example, 1105C may comprise active apertures, or pre-beamlet forming mechanism 172B may comprise an active aperture array. As used herein, "active aperture array" refers to an array of active apertures such as 1105_C6A. It is appreciated that an active aperture array may comprise active apertures of different sizes, cross-sections, shapes, configurations, or materials.

In some embodiments, active aperture 1105_C6A may comprise an active aperture assembly fabricated using techniques including, but are not limited to, mechanical machining, MEMS fabrication techniques, chemical etching, laser cutting, micro-machining or the like. Pre-beamlet forming mechanism 172B comprising an active aperture array may be fabricated from electrically conducting, semiconducting, or insulating materials, based on the application. For example, in some embodiments, top aperture plate 1120, active deflector 1130, and bottom aperture plate 1140 of active aperture 1105_C6A may be fabricated using semiconducting materials, and spacer layers (not shown in FIG. 11E) may be fabricated using electrically insulating materials.

In some embodiments, top aperture plate 1120 may be configured to allow a portion of the electrons of primary electron beam 102 to pass through based on the desired current setting. Top aperture plate 1120 may comprise a plurality of off-axis apertures 1122 separated by the material from which top aperture plate 1120 is fabricated. Off-axis apertures 1122 may comprise apertures having, but are not limited to, a circular, elliptical, rectangular, elongated, non-circular, polygonal cross-section. Off-axis apertures 1122 in an active aperture array of pre-beamlet forming mechanism 172B may be non-uniform in size, pitch, cross-section, or the like.

In some embodiments, bottom aperture plate 1140 may comprise a plurality of off-axis apertures 1142 separated by the material from which bottom aperture plate 1140 is fabricated. Off-axis apertures 1142 may comprise apertures having, but are not limited to, a circular, elliptical, rectangular, elongated, non-circular, polygonal cross-section. Off-axis apertures 1142 in an active aperture array of pre-beamlet forming mechanism 172B may be non-uniform in size, pitch, cross-section, or the like. In some embodiments, the geometric center of off-axis aperture 1122 may be aligned with a geometric center of the corresponding off-axis aperture 1142. In some embodiments, sizes of off-axis aperture 1122 and the corresponding off-axis aperture 1142 may be substantially similar.

In some embodiments, top aperture plate 1120 or bottom aperture plate 1140 may be electrically grounded. In the context of this disclosure, electrical ground refers to a reference point in the active aperture 1105_C6A from which applied voltages are measured. For example, if top aperture plate 1120 or bottom aperture plate 1140 are electrically grounded and a voltage signal of +100 V is applied to active deflector 1130, then the effective voltage applied to active deflector 1130 is +100 V.

In some embodiments, active deflector 1130 may comprise a single-pole deflector, or a multipole deflector configured to be electrically activated to influence the path of the portion of the electrons of primary electron beam 102. Although FIG. 11E illustrates a dual-pole deflector, active deflector 1130 may comprise any number of poles, as appropriate. The poles of active deflector 1130 may be radially arranged along a plane substantially perpendicular to primary optical axis 100_1 and substantially parallel to top aperture 1120 or bottom aperture plate 1140. In some embodiments, aperture 1132 formed in active deflector plate 1130 may be larger or equal in size compared to off-axis apertures 1122 or 1142.

Although apertures of the set of off-axis apertures enable generating a large range of beam currents while reducing the transmission area of electrons and, thereby reducing the Coulomb interaction effects, further reduction of Coulomb interaction effects may be desirable for high resolution applications. In some embodiments, active aperture array may be configured to generate a plurality of off-axis beamlets from primary electron beam 102 while further reducing the Coulomb interaction effects.

In some embodiments, active deflector 1130 may be electrically activated by applying an electrical signal to one or more poles based on factors including, desired current setting, image resolution, or deflection of electron, or beamlet size, among other things. In some embodiments, the electrical signal may comprise a voltage signal suitable for deflecting a portion of electrons of primary electron beam 102 exiting off-axis aperture 1122. In some embodiments, one or more poles of active deflector 1130 may be electrically grounded, one or more poles of active deflector 1130 may be electrically activated, or combinations thereof, based on the desired beamlet characteristics.

In some embodiments, bottom aperture plate 1140 may comprise an aperture 1142 aligned with corresponding off-axis aperture 1132 or corresponding off-axis aperture 1122. Aperture 1142 may be smaller in size compared to aperture 1132 of active deflector plate 1130. In some embodiments, aperture 1142 may be configured to block the deflected electrons exiting aperture 1132, thereby generating a beamlet comprising fewer electrons and resultantly reducing the Coulomb interaction effects within the generated beamlet.

In some embodiments, apparatus 300 may comprise prebeamlet forming mechanism 172B of FIG. 11B including one or more sets of off-axis active apertures such as 1105C, and may also comprise beam limit aperture array 121 of FIG. 3. Active aperture 1105_C6A may be configured to generate an off-axis primary beamlet (e.g., beamlet 102_2 of FIG. 2) from primary electron beam 102. In some embodiments, beam limit aperture 121_2, for example, may be configured to receive beamlet 102_2 and generate a probing beamlet having an associated beam current, from the corresponding primary beamlet. The associated beam current of the probing beamlet may be adjustable at least based on a size of off-axis aperture 1122, or the electric field between top aperture plate 1120 and active deflector 1130, or both.

In some embodiments, the associated beam current of the probing beamlet may be adjustable in discrete ranges. For example, a set of off-axis active apertures 1105_CA (not illustrated, but in some embodiments similar to 1105C of FIG. 11B) may comprise a plurality of off-axis active apertures (1105_C1A, 1105_C2A, 1105_C3A, 1105_C4A, 1105_C5A, and 1105_C6A, not illustrated, but in some embodiments similar to 1105C_1 to 1105C_6). One or more off-axis active apertures may be dissimilar in size, shape, or cross-section. The size of off-axis apertures may determine the size of the beam or the number of electrons passing through, thereby allowing an adjustment of beam current based on the size of the off-axis active aperture the beam is directed to pass through. It is appreciated that the set of off-axis active apertures 1105_CA may comprise fewer or more active apertures, as needed.

In some embodiments, the voltage signal applied to active deflector 1130 may be fixed or substantially fixed. The electric field, formed as a result of fixed voltage signals applied to top aperture plate 1120 and active deflector 1130, may be fixed or substantially fixed. In such cases, beam current of the probing beamlet may be adjusted at least based on a selected aperture size of off-axis aperture 1122. In some embodiments, the selected off-axis aperture 1122 may be predetermined or dynamically determined based on factors including, but are not limited to, material, desired analysis, resolution feedback, among other things.

In some embodiments, the voltage signal applied to active deflector 1130 may be adjustable. The electric field, formed as a result of adjustable voltage signals applied to active deflector 1130, may be adjustable. In such cases, beam current of the probing beamlet may be determined based on the electric field between top aperture plate 1120 and active deflector 1130. The electric field formed by the difference in voltage signals applied between top aperture plate 1120 and active deflector 1130 may deflect the path of a portion of charged particles (e.g., electrons) passing through active aperture 1105_C6A such that some of the peripheral electrons may be blocked by bottom aperture plate 1140. The primary beamlet formed may contain fewer electrons as a result of deflection from the electric field and blocking of the peripheral electrons, and therefore, the beam current of the corresponding probing beamlet formed may be reduced.

In some embodiments, the beam current of the probing beamlet may be adjusted by selecting a size of aperture 1122 of active aperture 1105_C6A, or adjusting the electric field in active aperture 1105_C6A by adjusting the difference in voltage signals applied to top aperture plate 1120 and active deflector 1130, or by selecting an aperture of beam limit aperture array 121 configured to generate the probing beamlet based on the size of the beamlet allowed to pass through, or a combination thereof.

Figure 11F:
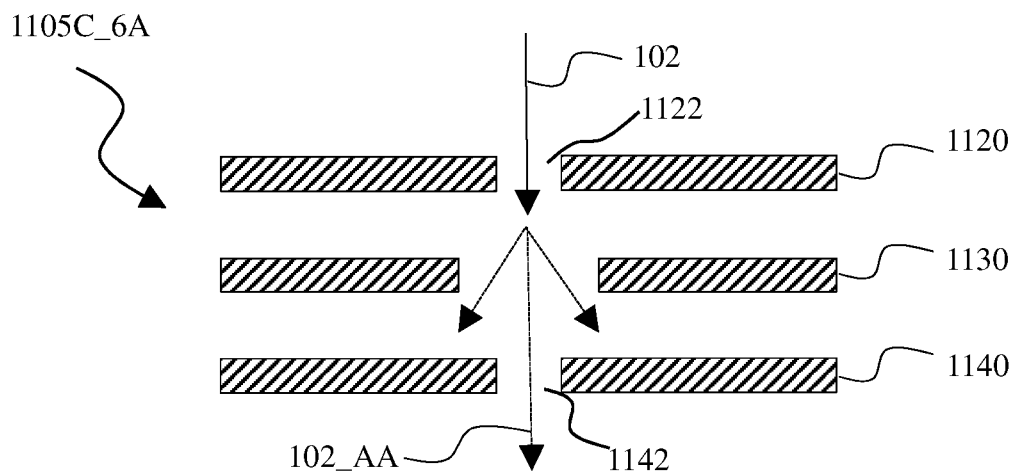
FIG. 11F illustrates a cross-section view of the exemplary aperture of FIG. 11E, consistent with embodiments of the present disclosure.

Reference is now made to FIG. 11F, which illustrates a cross-section view of the active aperture 1105_C6A, consistent with embodiments of the present disclosure. As illustrated in FIG. 11F, a portion of primary electron beam 102 may enter active aperture 1105_C6A through aperture 1122 of top aperture plate 1120 and beamlet 102_AA may exit active aperture 1105_C6A through aperture 1142 of bottom aperture plate 1140. In some embodiments, active deflector 1130 may be electrically activated to deflect peripheral electrons of primary electron beam 102 such that they may be blocked by bottom aperture plate 1140. The deflection of peripheral electrons may be determined based on the characteristics of the electrical signal applied to active deflector 1130. The electrical signal may comprise a voltage signal and the characteristics of the voltage signal may include a polarity or an amplitude, among other things.

In some embodiments, the electrical activation of active deflector 1130 may be dynamically adjusted based on the application, desired analysis, or system performance, among other things. For example, the imaging resolution may be adjusted by adjusting the electrical activation of active deflector 1130 based on scan resolution information obtained using a feedback mechanism. In some embodiments, active aperture 1105_C6A may be configured to be controlled using circuitry (not shown in FIGS. 11E and 11F). The circuitry may comprise a microprocessor, a sensing circuit, on-off driver circuit, voltage regulation circuit, memory, timing circuits, among other things. It is appreciated that the circuitry may include other relevant components, as appropriate.

In some embodiments, deflector poles of active apertures in an active aperture array having a substantially similar aperture size corresponding to a current setting may be electrically grouped. The electrical grouping of deflector poles of active apertures having a substantially similar size may be desirable because it may limit the number of electrical connections, and therefore, improve system integration, operation, and control.

Figure 12:
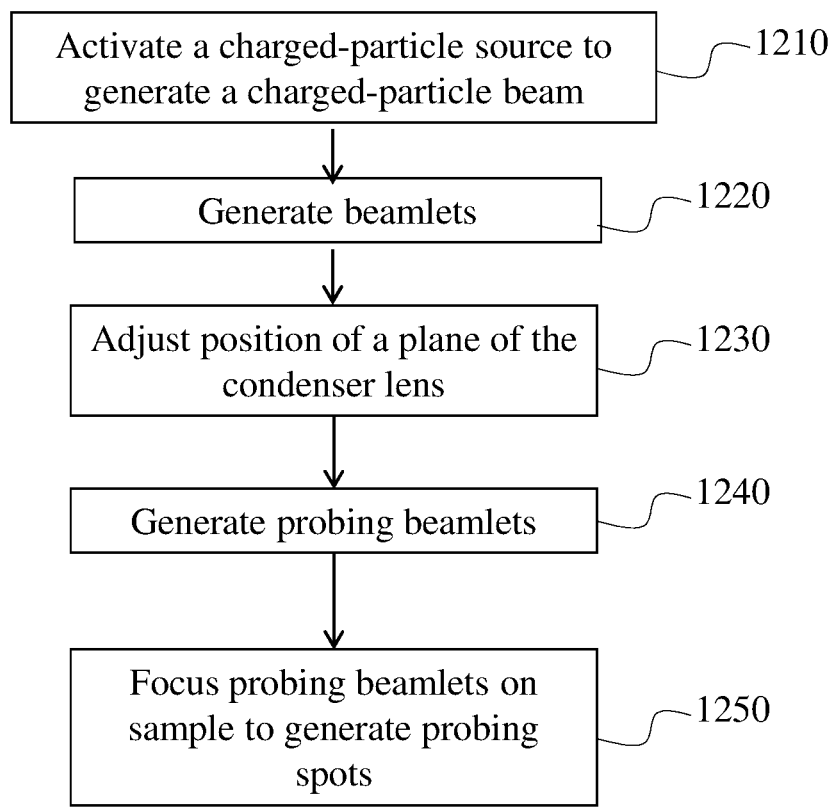
FIG. 12 is a process flowchart representing an exemplary method of observing a sample using a multi-beam inspection tool, consistent with embodiments of the present disclosure.

Reference is now made to FIG. 12, which illustrates a process flowchart representing an exemplary method 1200 of observing a sample using a multi-beam inspection tool, consistent with embodiments of the present disclosure. Method 1200 may be performed by controller 50 of EBI system 100, as shown in FIG. 1, for example Controller 50 may be programmed to implement one or more steps of method 1200. For example, controller 50 may instruct a module of a charged particle beam apparatus to activate a charged-particle source to generate charged particle beam and carry out other functions.

In step 1210, a charged-particle beam (e.g., primary electron beam 102 of FIG. 2) may be generated by activating a charged-particle source (e.g., electron source 101 of FIG. 2). For example, electron source 101 may be powered on to emit the primary electron beam that is formed along a primary optical axis. The electron source may be activated remotely, for example, by using a software, an application, or a set of instructions for a processor of a controller to power the electron source through a control circuitry. The primary electron beam may be trimmed by a gun aperture plate (e.g., gun aperture plate 171 of FIG. 2) or an aperture array (e.g., pre-beamlet-forming mechanism 172 of FIG. 2), or both.

In step 1220, a plurality of beamlets (e.g., beamlets 102_1, 102_2, and 102_3 of FIG. 3) may be generated after passing through the pre-beamlet forming mechanism (e.g., pre-beamlet forming mechanism 172 of FIG. 3). The number of beamlets generated may be based on the number of pre-trimming apertures of the pre-beamlet forming mechanism. For illustrative purposes, three beamlets and three pre-trimming apertures are shown in, for example, FIG. 3. The beamlets generated after the primary electron beam passes through the pre-beamlet forming mechanism may include an on-axis beamlet and at least one off-axis beamlet. In some embodiments, a plurality of off-axis beamlets may be generated. The pre-beamlet forming mechanism may comprise an on-axis aperture and at least one off-axis aperture. The on-axis aperture may be circular or substantially circular in shape or cross-section. The off-axis apertures may be elongated apertures having rounded ends and a tapering width.

In some embodiments, the off-axis apertures may be elongated and curved (e.g., such as off-axis apertures 172_2C-172_9C of FIG. 7B). In some embodiments, one or more of the off-axis apertures may involve a first aperture overlapping with a second aperture (e.g., merged apertures 1101C-1104C of FIG. 11A). In some embodiments the shape of the off-axis apertures may be based on paths of corresponding beamlets associated with adjustable probe currents of the probing beamlets, on the adjustability of the plane of the condenser lens, and on characteristics of the second aperture array.

In step 1230, the position of a plane (e.g., principal plane 110_2 of FIG. 3) of a condenser lens (e.g., condenser lens 110 of FIG. 2) may be adjusted along the primary optical axis. In some embodiments, the adjustable plane may be the principal plane of the condenser lens. The position of the principal plane of the condenser lens may be adjusted in relation to the position of the pre-beamlet forming mechanism and the beam-limit aperture array (e.g., beam-limit aperture array 121 of FIG. 3), to adjust the probe currents of the probing beamlets generated by the beam-limit aperture array. For example, if the principal plane of the condenser lens is closer to beam-limit aperture array than the pre-beamlet forming mechanism, the beam currents of the on-axis beamlet and the off-axis beamlets exiting beam-limit aperture array may be lower than when the principal plane is closer to pre-beamlet forming mechanism.

In some embodiments, in multi-beam apparatus comprising an adjustable electromagnetic condenser lens, off-axis beamlets may illuminate beam-limit aperture array with rotation angles. The rotation angles may change with the focusing power or the position of principal plane of the adjustable condenser lens along the primary optical axis. The off-axis beamlets may be rotated by an angle such that the off-axis beamlet passes through the corresponding off-axis aperture of the beam-limit aperture array.

In some embodiments, adjusting the position of the principal plane of the condenser lens may modify the characteristics of probing beamlets exiting the beam-limit aperture array. The characteristics of probing beamlets may include, but are not limited to, the probe current of probing beamlets, the portion of the beamlet from which the probing beamlet may be generated, etc.

In step 1240, probing beamlets may be generated from the plurality of beamlets by the beam-limit aperture array (e.g., beam-limit aperture array 121 of FIGS. 3 & 9). The characteristics of the probing beamlets may be determined based on the characteristics of beam-limit aperture array. The characteristics of beam-limit aperture array may include, but not limited to, size, cross-section, shape, pitch, positioning of the apertures. The characteristics of probing beamlets may be determined by one or more characteristics of the beam-limit aperture array.

In some embodiments, the position of beam-limit aperture array may be fixed. For example, beam-limit aperture array may be disposed on a plane normal to the primary optical axis and at a predetermined distance from the condenser lens or the pre-beamlet forming mechanism. In some embodiments, the beam-limit aperture array may comprise apertures having uniform shapes, sizes, cross-sections and pitch. In some embodiments, the apertures may be non-uniform as well.

In step 1250, the probing beamlets generated by the beam-limit aperture array may be focused and directed towards the sample (e.g., sample 190 of FIG. 2) to form probe spots (e.g., probe spots 102_1S, 102_2S, and 102_3S of FIG. 2). In some embodiments, each of the plurality of probing beamlets may form a probe spot on the sample. The probing beamlets may be focused using an objective lens (e.g., objective lens 131 of FIG. 3). The probing beamlets may be incident normal to the sample surface. The primary electrons of probing beamlets incident on the sample may generate secondary electrons. The secondary electrons may be detected using a secondary electron detector or a backscattered electron detector, thus revealing information about the sample being probed.

Figure 13:
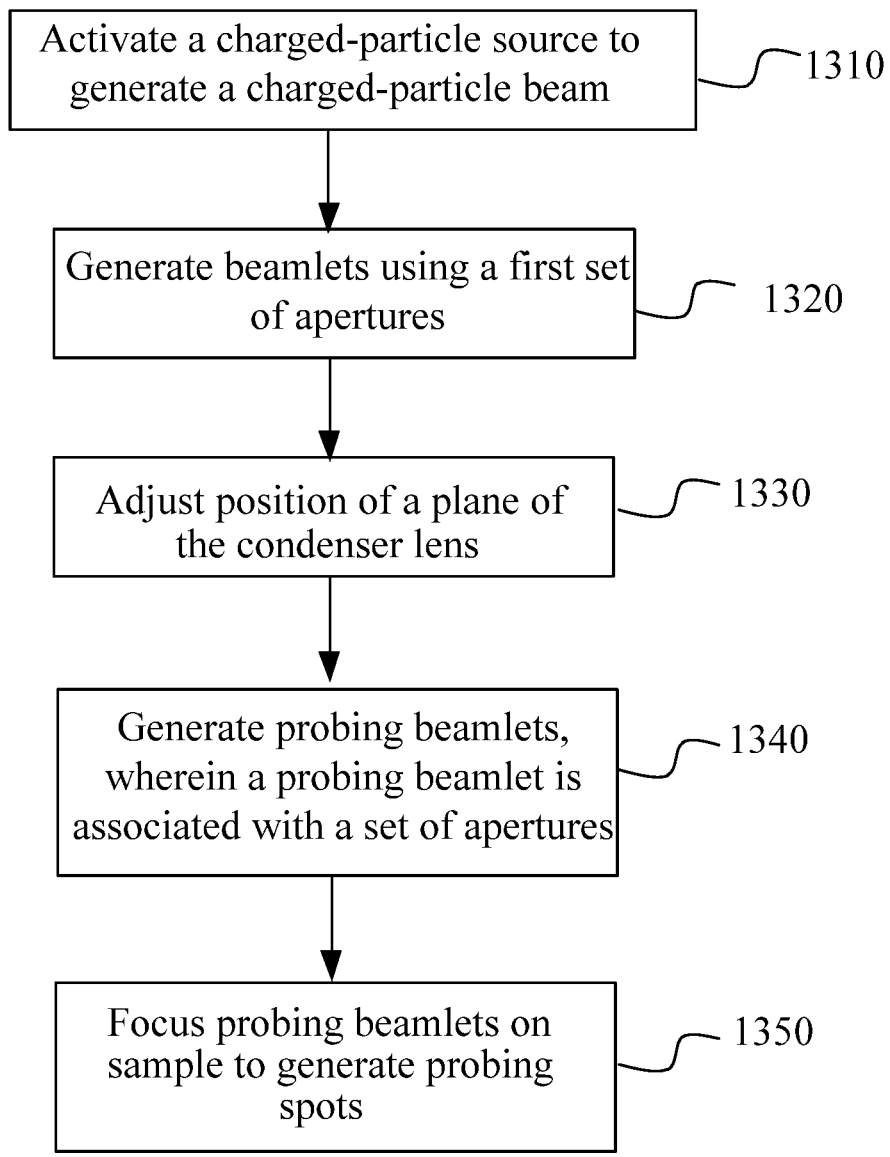
FIG. 13 is a process flowchart representing an exemplary method of observing a sample using a multi-beam inspection tool, consistent with embodiments of the present disclosure.

Reference is now made to FIG. 13, which illustrates a process flowchart representing an exemplary method 1300 of observing a sample using a multi-beam inspection tool, consistent with embodiments of the present disclosure. Method 1300 may be performed by controller 50 of EBI system 100, as shown in FIG. 1, for example Controller 50 may be programmed to implement one or more steps of method 1300. For example, controller 50 may instruct a module of a charged particle beam apparatus to activate a charged-particle source to generate charged particle beam and carry out other functions.

In step 1310, a charged-particle beam (e.g., primary electron beam 102 of FIG. 2) may be generated by activating a charged-particle source (e.g., electron source 101 of FIG. 2). For example, electron source 101 may be powered on to emit the primary electron beam that is formed along a primary optical axis (e.g., primary optical axis 100_1 of FIG. 2). The electron source may be activated remotely, for example, by using a software, an application, or a set of instructions for a processor of a controller to power the electron source through a control circuitry. The primary electron beam may be trimmed by a gun aperture plate (e.g., gun aperture plate 171 of FIG. 2) or an aperture array (e.g., pre-beamlet-forming mechanism 172 of FIG. 2), or both.

In step 1320, a plurality of beamlets (e.g., beamlets 102_1, 102_2, and 102_3 of FIG. 3) may be generated after passing through the pre-beamlet forming mechanism (e.g., pre-beamlet forming mechanism 172B of FIG. 11B). The number of primary beamlets generated may be based on the number of apertures of the pre-beamlet forming mechanism. For illustrative purposes, three beamlets and three apertures are shown in, for example, FIG. 3. The beamlets generated after the primary electron beam passes through the pre-beamlet forming mechanism may include an on-axis primary beamlet and at least off-axis primary beamlet. In some embodiments, a plurality of off-axis beamlets may be generated. The pre-beamlet forming mechanism may comprise an on-axis aperture and at least one set of off-axis apertures (e.g., the set of off-axis apertures 1105C of FIG. 11B). The on-axis aperture may be circular or substantially circular in shape or cross-section. A cross-section of the apertures of the set of off-axis apertures may be circular, rectangular, substantially circular, elliptical, or polygonal, or the like. The cross-section of the apertures may determine the cross-section and shape of the primary beamlets generated thereby. The primary beamlets generated by apertures of pre-beamlet forming mechanism 172B may be incident on condenser lens (e.g., condenser lens 110 of FIG. 2).

In step 1330, the position of a plane (e.g., principal plane 110_2 of FIG. 3) of the condenser lens may be adjusted along the primary optical axis. In some embodiments, condenser lens 110 may comprise an adjustable electromagnetic lens configured to cause a primary beamlet to form a corresponding probing beamlet exiting beam limit aperture array (e.g., beam limit aperture array 121 of FIGS. 3 and 9). Based on the settings of condenser lens 110, a primary beamlet formed by an aperture of the set of off-axis apertures may be incident on the corresponding aperture of the beam limit aperture array with rotation angles. The rotation angles may change with the focusing power or the position of principal plane of the adjustable condenser lens along the primary optical axis. For example, if the condenser lens is positioned closer to the electron source, the probing beamlet generated from aperture (e.g., 1105C_6 of FIG. 11B) may be incident on the corresponding off-axis aperture of the beam limit aperture array.

In step 1340, a plurality of probing beamlets may be generated from the plurality of primary beamlets by the beam-limit aperture array. An on-axis probing beamlet may be associated with a corresponding on-axis primary beamlet and an off-axis probing beamlet may be associated with a corresponding set of off-axis apertures of the pre-beamlet forming mechanism 172B. The characteristics of the probing beamlets formed may be determined based on the characteristics of the beam-limit aperture array. The characteristics of beam-limit aperture array may include, but not limited to, size, cross-section, shape, pitch, positioning of the apertures. The characteristics of probing beamlets may be determined by one or more characteristics of the beam-limit aperture array.

In step 1350, the probing beamlets generated by the beam-limit aperture array may be focused and directed towards the sample (e.g., sample 190 of FIG. 2) to form probe spots (e.g., probe spots 102_1S, 102_2S, and 102_3S of FIG. 2). In some embodiments, each of the plurality of probing beamlets may form a probe spot on the sample. The probing beamlets may be focused using an objective lens (e.g., objective lens 131 of FIG. 3). The probing beamlets may be incident normal to the sample surface. The primary electrons of probing beamlets incident on the sample may generate secondary electrons. The secondary electrons may be detected using a secondary electron detector or a backscattered electron detector, thus revealing information about the sample being probed.

Figure 14:
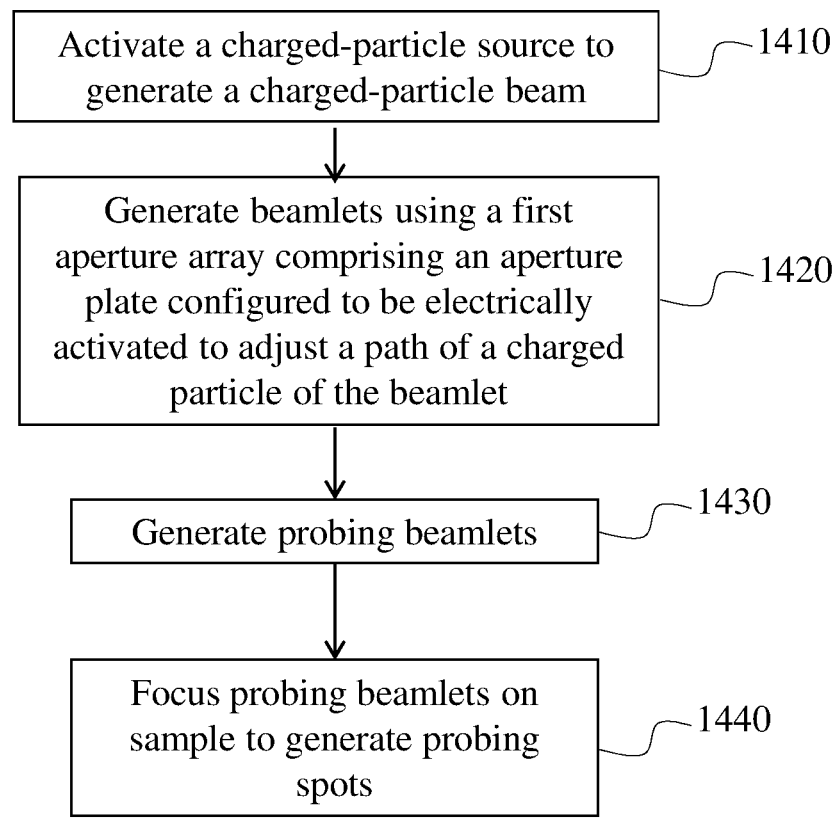
FIG. 14 is a process flowchart representing an exemplary method of observing a sample using a multi-beam inspection tool, consistent with embodiments of the present disclosure.

Reference is now made to FIG. 14, which illustrates a process flowchart representing an exemplary method 1400 of observing a sample using a multi-beam inspection tool, consistent with embodiments of the present disclosure. Method 1400 may be performed by controller 50 of EBI system 100, as shown in FIG. 1, for example Controller 50 may be programmed to implement one or more steps of method 1400. For example, controller 50 may instruct a module of a charged particle beam apparatus to activate a charged-particle source to generate charged particle beam and carry out other functions as well.

In step 1410, a charged-particle beam (e.g., primary electron beam 102 of FIG. 2) may be generated by activating a charged-particle source (e.g., electron source 101 of FIG. 2). For example, electron source 101 may be powered on to emit the primary electron beam that is formed along a primary optical axis (e.g., primary optical axis 100_1 of FIG. 2). The electron source may be activated remotely, for example, by using a software, an application, or a set of instructions for a processor of a controller to power the electron source through a control circuitry. The primary electron beam may be trimmed by a gun aperture plate (e.g., gun aperture plate 171 of FIG. 2) or an aperture array (e.g., pre-beamlet-forming mechanism 172 of FIG. 2), or both.

In step 1420, a plurality of beamlets (e.g., beamlets 102_1, 102_2, and 102_3 of FIG. 3) may be generated after passing through the pre-beamlet forming mechanism (e.g., pre-beamlet forming mechanism 172B of FIG. 11B). The number of primary beamlets generated may be based on the number of apertures of the pre-beamlet forming mechanism. For illustrative purposes, three beamlets and three apertures are shown in, for example, FIG. 3. The beamlets generated after the primary electron beam passes through the pre-beamlet forming mechanism may include an on-axis primary beamlet and at least off-axis primary beamlet. In some embodiments, a plurality of off-axis beamlets may be generated. The pre-beamlet forming mechanism may comprise an on-axis aperture and at least one set of off-axis apertures (e.g., the set of off-axis apertures 1105C of FIG. 11B).

In some embodiments, the set of off-axis apertures 1105C may include an active aperture (e.g., active aperture 1105_C6A of FIG. 11E). An exemplary active aperture 1105_C6A may comprise a top aperture plate (e.g., top aperture plate 1120 of FIG. 11E), an active deflector (e.g., active deflector 1130 of FIG. 11E), and a bottom aperture plate (e.g., bottom aperture plate 1140 of FIG. 11E). Although active aperture 1105_C6A is shown to include three elements, it is appreciated that there may be more elements such as spacer layers, microlens, as appropriate. In some embodiments, active aperture 1105_C6A may comprise an active aperture assembly fabricated using techniques including, but are not limited to, mechanical machining, MEMS fabrication techniques, chemical etching, laser cutting, micro-machining or the like. Pre-beamlet forming mechanism 172B comprising an active aperture array may be fabricated from electrically conducting, semiconducting, or insulating materials, based on the application.

The top aperture plate may be configured to allow a portion of the electrons of the primary electron beam to pass through based on the desired current setting. The bottom aperture plate may comprise a plurality of off-axis apertures (e.g., aperture 1142 of FIG. 11E) separated by the material from which top aperture plate is fabricated. The top aperture plate and the bottom aperture plate may be electrically grounded or maintained at a reference voltage. Active deflector may comprise a single-pole deflector, or a multi-pole deflector configured to be electrically activated to influence the path of the portion of the electrons of the primary electron beam.

The active deflector may be electrically activated by applying an electrical signal to one or more poles. In some embodiments, the electrical signal may comprise a voltage signal suitable for deflecting a portion of electrons of the primary electron beam exiting off-axis aperture 1122. In some embodiments, active deflector may be electrically activated to deflect peripheral electrons of the primary electron beam such that they may be blocked by the bottom aperture plate. The deflection of peripheral electrons may be determined based on the characteristics of the electrical signal applied to the active deflector. The electrical signal may comprise a voltage signal and the characteristics of the voltage signal may include a polarity, an amplitude, among other things.

The on-axis aperture may be circular or substantially circular in shape or cross-section. A cross-section of the apertures of the set of off-axis apertures may be circular, rectangular, substantially circular, elliptical, or polygonal, or the like. The cross-section of the apertures may determine the cross-section and shape of the primary beamlets generated thereby. The primary beamlets generated by apertures of pre-beamlet forming mechanism 172B may be incident on condenser lens (e.g., condenser lens 110 of FIG. 2).

In step 1430, a plurality of probing beamlets may be generated from the plurality of primary beamlets by the beam-limit aperture array. An on-axis probing beamlet may be associated with a corresponding on-axis primary beamlet, and an off-axis probing beamlet may be associated with a corresponding set of off-axis apertures of the pre-beamlet forming mechanism 172B. The characteristics of the probing beamlets formed may be determined based on the characteristics of the beam-limit aperture array. The characteristics of beam-limit aperture array may include, but are not limited to, size, cross-section, shape, pitch, positioning of the apertures. The characteristics of probing beamlets may be determined by one or more characteristics of the beam-limit aperture array.

In step 1440, the probing beamlets generated by the beam-limit aperture array may be focused and directed towards the sample (e.g., sample 190 of FIG. 2) to form probe spots (e.g., probe spots 102_1S, 102_2S, and 102_3S of FIG. 2). In some embodiments, each of the plurality of probing beamlets may form a probe spot on the sample. The probing beamlets may be focused using an objective lens (e.g., objective lens 131 of FIG. 3). The probing beamlets may be incident normal to the sample surface. The primary electrons of probing beamlets incident on the sample may generate secondary electrons. The secondary electrons may be detected using a secondary electron detector or a back-scattered electron detector, thus revealing information about the sample being probed.

The embodiments may further be described using the following clauses:

1. A charged-particle beam apparatus comprising:
   a charged-particle source configured to generate a primary charged-particle beam along a primary optical axis;
   a first aperture array comprising a first plurality of apertures configured to generate a plurality of primary beamlets from the primary charged-particle beam;
   a condenser lens comprising a plane adjustable along the primary optical axis; and
   a second aperture array comprising a second plurality of apertures configured to generate a plurality of probing beamlets,
   wherein each of the plurality of probing beamlets comprises a portion of charged particles of a corresponding primary beamlet, and
   wherein the portion of the charged particles is determined based on at least a position of the plane of the condenser lens and characteristics of the second aperture array.

2. The apparatus of clause 1, wherein the first aperture array comprises a pre-beamlet forming aperture array disposed between the charged-particle source and the condenser lens.

3. The apparatus of any one of clauses 1 and 2, wherein the first aperture array comprises an on-axis aperture configured to generate an on-axis beamlet, the on-axis beamlet being incident on an on-axis aperture of the second aperture array.

4. The apparatus of any one of clauses 1-3, wherein the first aperture array comprises an off-axis aperture configured to generate an off-axis beamlet, the off-axis beamlet incident on a corresponding off-axis aperture of the second aperture array.

5. The apparatus of clause 4, wherein the off-axis aperture of the first aperture array comprises an elongated aperture having rounded ends and a tapering width.

6. The apparatus of clause 5, wherein the off-axis aperture of the first aperture array has a curved form.

7. The apparatus of any one of clauses 4-6, wherein the off-axis aperture is oriented such that the width tapers towards the primary optical axis.

8. The apparatus of any one of clauses 4-7, wherein the condenser lens is configured to cause a portion of the off-axis beamlet to form a corresponding probing beamlet of the plurality of probing beamlets.

9. The apparatus of any one of clauses 1-8, wherein the second aperture array comprises a beam-limiting aperture array disposed between the condenser lens and an objective lens.

10. The apparatus of any one of clauses 1-9, wherein the second plurality of apertures is configured to determine a size and a shape of the plurality of probing beamlets.

11. The apparatus of any one of clauses 1-10, wherein the characteristics of the second aperture array comprises at least one of sizes, shapes, and arrangement of the second plurality of apertures.

12. The apparatus of any one of clauses 1-11, wherein the condenser lens comprises an electrostatic, electromagnetic, or an electromagnetic compound lens.

13. The apparatus of any one of clauses 1-12, wherein the first plurality of apertures comprises a plurality of off-axis apertures.

14. The apparatus of clause 13, wherein the plurality of off-axis apertures includes an aperture having a first off-axis aperture overlapping with a second off-axis aperture, wherein the first off-axis aperture enables the second aperture array to generate a first-off axis probing beamlet and the second off-axis aperture enables the second aperture array to generate a second off-axis probing beamlet.

15. The apparatus of clause 13, wherein each of the plurality of off-axis apertures of the first aperture array are separated by a substrate material of the first aperture array.

16. The apparatus of any one of clauses 3-15, wherein the on-axis aperture of the first aperture array is substantially circular.

17. The apparatus of any one of clauses 4-16, wherein an area of the on-axis aperture of the first aperture array is substantially similar to an area of the off-axis aperture.

18. A first aperture array comprising:
a first plurality of apertures configured to generate a plurality of primary beamlets from a primary charged-particle beam, wherein:
a portion of charged particles of a primary beamlet of the plurality of primary beamlets forms a corresponding probing beamlet of a plurality of probing beamlets, and
the portion of the charged particles is determined based on at least a position of a plane of a condenser lens and characteristics of a second aperture array, wherein the second aperture array is configured to generate the plurality of probing beamlets.

19. The first aperture array of clause 18, further comprising a pre-beamlet forming aperture array disposed between a charged-particle source and the condenser lens.

20. The first aperture array of any one of clauses 18 and 19, further comprising an on-axis aperture configured to generate an on-axis beamlet, the on-axis beamlet being incident on an on-axis aperture of the second aperture array.

21. The first aperture array of any one of clauses 18-20, further comprising an off-axis aperture configured to generate an off-axis beamlet, the off-axis beamlet incident on a corresponding off-axis aperture of the second aperture array.

22. The first aperture array of clause 21, wherein the off-axis aperture comprises an elongated aperture having rounded ends and a tapering width.

23. The first aperture array of clause 22, wherein the off-axis aperture has a curved form.

24. The first aperture array of any one of clauses 21-23, wherein the off-axis aperture is oriented such that the width tapers towards a primary optical axis.

25. The first aperture array of any one of clauses 18-24, wherein the first plurality of apertures comprises a plurality of off-axis apertures.

26. The first aperture array of clause 25, wherein the plurality of off-axis apertures includes an aperture having a first off-axis aperture overlapping with a second off-axis aperture, wherein the first off-axis aperture enables the second aperture array to generate a first-off axis probing beamlet and the second off-axis aperture enables the second aperture array to generate a second off axis probing beamlet.

27. The first aperture array of any one of clauses 25 and 26, wherein each of the plurality of off-axis apertures are separated by a substrate material of the first aperture array.

28. The first aperture array of any one of clauses 20-27, wherein the on-axis aperture is substantially circular.

29. The first aperture array of any one of clauses 21-28, wherein an area of the on-axis aperture of the first aperture array is substantially similar to an area of the off-axis aperture.

30. A method of observing a sample using a multi-beam apparatus, the method comprising:
activating a charged-particle source to generate a primary charged-particle beam;
generating, using a first aperture array, a plurality of primary beamlets from the primary charged-particle beam;
generating, using a second aperture array, a plurality of probing beamlets corresponding to the plurality of primary beamlets;
adjusting a position of a plane of a condenser lens along a primary optical axis in relation to the first and the second aperture array; and
generating, from the plurality of probing beamlets, a plurality of probe spots incident on a surface of the sample,
wherein each of the plurality of probing beamlets comprises a portion of charged particles of a corresponding primary beamlet of the plurality of primary beamlets, and
wherein the portion of the charged particles is determined based on at least a position of the plane of the condenser lens and characteristics of the second aperture array.

31. The method of clause 30, wherein adjusting the position of the plane of the condenser lens modifies characteristics of the probing beamlets.

32. The method of any one of clauses 30 and 31, wherein adjusting the position of the plane of the condenser lens modifies currents of the probing beamlets.

33. The method of any one of clauses 30-32, wherein generating the plurality of primary beamlets comprises generating an on-axis beamlet and an off-axis beamlet.

34. The method of clause 33, further comprising causing, using the condenser lens, a portion of the off-axis beamlet to form a corresponding probing beamlet of the plurality of probing beamlets.

35. A non-transitory computer readable medium storing a set of instructions that is executable by one or more processors of a multi-beam apparatus having first and second aperture arrays to cause the multi-beam apparatus to perform a method comprising:
activating a charged-particle source to generate a primary charged-particle beam; and
adjusting a position of a plane of a condenser lens along a primary optical axis in relation to the first aperture array and the second aperture array, wherein:

the first aperture array is configured to generate a plurality of primary beamlets from the primary charged-particle beam using a first plurality of apertures, a portion of charged particles of a primary beamlet of the plurality of primary beamlets forms a corresponding probing beamlet, and the portion of the charged particles is determined based on at least a position of the plane of the condenser lens and characteristics of the second aperture array.

36. A charged-particle beam apparatus comprising:
a charged-particle source configured to generate a primary charged-particle beam along a primary optical axis;
a first aperture array comprising multiple sets of apertures configured to form a plurality of primary beamlets from the primary charged-particle beam;
a condenser lens disposed on a plane normal to the primary optical axis; and
a second aperture array comprising a plurality of apertures configured to generate a plurality of probing beamlets,
wherein a probing beamlet of the plurality of probing beamlets is associated with a set of apertures of the first aperture array, and
wherein an aperture of the set of apertures forming the probing beamlet is determined at least based on a characteristic of the condenser lens.

37. The apparatus of clause 36, wherein the first aperture array comprises a pre-beamlet forming aperture array disposed between the charged-particle source and the condenser lens.

38. The apparatus of any one of clauses 36 and 37, wherein the first aperture array comprises an on-axis aperture configured to generate an on-axis primary beamlet, the on-axis primary beamlet being incident on an on-axis aperture of the second aperture array.

39. The apparatus of any one of clauses 36-38, wherein the first aperture array comprises the multiple sets of off-axis apertures configured to generate a plurality of off-axis primary beamlets, an off-axis primary beamlet being incident on a corresponding off-axis aperture of the second aperture array.

40. The apparatus of any one of clauses 36-39, wherein a set of the multiple sets of off-axis apertures includes apertures disposed along a curved path.

41. The apparatus of any one of clauses 36-40, wherein a set of the multiple sets of off-axis apertures includes at least two apertures having a different size.

42. The apparatus of any one of clauses 36-41, wherein a set of the multiple sets of off-axis apertures includes apertures that are sized to determine a current of the corresponding primary beamlet.

43. The apparatus of any one of clauses 36-42, wherein a set of the multiple sets of off-axis apertures includes apertures having a uniform pitch.

44. The apparatus of any one of clauses 36-42, wherein a set of the multiple sets of off-axis apertures includes apertures having a non-uniform pitch.

45. The apparatus of any one of clauses 36-44, wherein the multiple sets of off-axis apertures comprise apertures having a circular, rectangular, elliptical, or a polygonal cross-section.

46. The apparatus of any one of clauses 36-45, wherein the condenser lens is configured to cause a primary beamlet of the plurality of primary beamlets to form a corresponding probing beamlet of the plurality of probing beamlets.

47. The apparatus of any one of clauses 36-46, wherein the second aperture array comprises a beam-limiting aperture array disposed between the condenser lens and an objective lens.

48. The apparatus of any one of clauses 36-47, wherein the second plurality of apertures is configured to determine a size and a shape of the plurality of probing beamlets.

49. The apparatus of any one of clauses 36-48, wherein the condenser lens comprises an electrostatic, electromagnetic, or an electromagnetic compound lens.

50. The apparatus of any one of clauses 38-49, wherein the on-axis aperture of the first aperture array is substantially circular.

51. A first aperture array comprising:
multiple sets of apertures configured to form a plurality of primary beamlets from a primary charged-particle beam, wherein:
a probing beamlet of a plurality of probing beamlets is associated with a set of the multiple sets of apertures of the first aperture array, and
wherein an aperture of the set of apertures forming the probing beamlet is determined at least based on a characteristic of a condenser lens.

52. The first aperture array of clause 51, further comprising a pre-beamlet forming aperture array disposed between a charged-particle source and the condenser lens.

53. The first aperture array of any one of clauses 51 and 52, further comprising an on-axis aperture configured to generate an on-axis primary beamlet, the on-axis primary beamlet being incident on an on-axis aperture of a second aperture array.

54. The first aperture array of clause 53, wherein the on-axis aperture is substantially circular.

55. The first aperture array of any one of clauses 51-54, wherein the multiple sets of off-axis apertures are configured to generate a plurality of off-axis beamlets, an off-axis beamlet incident on a corresponding off-axis aperture of the second aperture array.

56. The first aperture array of any one of clauses 51-55, wherein a set of the multiple sets of off-axis apertures includes apertures disposed along a curved path.

57. The first aperture array of any one of clauses 51-56, wherein a set of the multiple sets of off-axis apertures includes at least two apertures having a different size.

58. The first aperture array of any one of clauses 51-57, wherein a set of the multiple sets of off-axis apertures includes apertures that are sized to determine a current of the corresponding primary beamlet.

59. The first aperture array of any one of clauses 51-58, wherein a set of the multiple sets of off-axis apertures includes apertures having a uniform pitch.

60. The first aperture array of any one of clauses 51-58, wherein a set of the multiple sets of off-axis apertures includes apertures having a non-uniform pitch.

61. The first aperture array of any one of clauses 51-60, wherein the multiple sets of off-axis apertures comprise apertures having a circular, rectangular, elliptical, or a polygonal cross-section.

62. A method of observing a sample using a multi-beam apparatus, the method comprising:
activating a charged-particle source to generate a primary charged-particle beam;
generating, using a first aperture array, a plurality of primary beamlets from the primary charged-particle beam;

generating, using a second aperture array, a plurality of probing beamlets corresponding to the plurality of primary beamlets;

adjusting a position of a plane of a condenser lens along a primary optical axis in relation to the first and the second aperture array; and generating, from the plurality of probing beamlets, a plurality of probe spots incident on a surface of the sample, wherein a probing beamlet of the plurality of probing beamlets is associated with a set of apertures of the first aperture array, and wherein an aperture of the set of apertures forming the probing beamlet is determined at least based on a characteristic of the condenser lens.

63. The method of clause 62, wherein adjusting the position of the plane of the condenser lens modifies characteristics of the probing beamlet.

64. The method of any one of clauses 62 and 63, wherein adjusting the position of the plane of the condenser lens modifies current of the probing beamlet.

65. The method of any one of clauses 62-64, wherein generating the plurality of primary beamlets comprises generating an on-axis primary beamlet and an off-axis primary beamlet.

66. The method of clause 65, further comprising causing, using the condenser lens, an off-axis primary beamlet to form a corresponding probing beamlet of the plurality of probing beamlets.

67. A non-transitory computer readable medium storing a set of instructions that is executable by one or more processors of a multi-beam apparatus having first and second aperture arrays to cause the multi-beam apparatus to perform a method comprising:

activating a charged-particle source to generate a primary charged-particle beam; and adjusting a position of a plane of a condenser lens along a primary optical axis in relation to the first aperture array and the second aperture array, wherein:

the first aperture array is configured to generate a plurality of primary beamlets from the primary charged-particle beam using a plurality of set of apertures, a primary beamlet of the plurality of primary beamlets forms a corresponding probing beamlet, and an aperture of the set of apertures forming the probing beamlet is determined at least based on a characteristic of the condenser lens.

68. A charged-particle beam apparatus comprising:

a first aperture array comprising a first plurality of apertures configured to form a plurality of primary beamlets from a primary charged-particle beam, an aperture of the first plurality of apertures comprising:

a first aperture plate configured to be at a first voltage; and a second aperture plate configured to be at a second voltage that is different from the first voltage for generating an electric field, which enables adjustment of a path of a charged particle of the primary charged-particle beam.

69. The apparatus of clause 68, further comprising a third aperture plate configured to be at a third voltage that is substantially similar to the first voltage.

70. The apparatus of any one of clauses 68 and 69, further comprising:

a condenser lens comprising a plane adjustable along a primary optical axis; and a second aperture array comprising a second plurality of apertures configured to generate a plurality of probing beamlets, wherein each of the plurality of probing beamlets comprises a portion of charged particles of a corresponding primary beamlet and the portion of the charged particles is based on at least a position of a plane of the condenser lens and a characteristic of the second aperture array.

71. The apparatus of any one of clauses 69 and 70, wherein the first and the third voltages comprise a reference voltage.

72. The apparatus of any one of clauses 68-71, wherein the second aperture plate comprises a charged-particle beam deflector configured to adjust the path of the charged particles in response to an electrical activation.

73. The apparatus of clause 72, wherein the charged-particle beam deflector comprises a single-pole deflector or a multi-pole deflector.

74. The apparatus of any one of clauses 72 and 73, wherein the electrical activation of the second aperture plate comprises a voltage signal being applied to generate the electric field.

75. The apparatus of clause 74, wherein the path of the charged particles is adjusted based on a characteristic of the voltage signal applied to the second aperture plate.

76. The apparatus of clause 75, wherein the characteristic of the voltage signal comprises a polarity or an amplitude.

77. The apparatus of any one of clauses 69-76, wherein the aperture of the first plurality of apertures comprises:

a first aperture in the first aperture plate;

a second aperture in the second aperture plate; and a third aperture in the third aperture plate, wherein the second aperture plate is disposed between the first and the third aperture plates, and wherein a geometric center of the first, the second, and the third apertures are aligned.

78. The apparatus of clause 77, wherein the first and the second apertures are dissimilar in size, and wherein the first and the third apertures are substantially similar in size.

79. The apparatus of any one of clauses 77-78, wherein the third aperture plate is configured to block a portion of charged particles exiting the second aperture.

80. The apparatus of any one of clauses 70-79, wherein the first aperture array comprises a pre-beamlet forming aperture array disposed between a charged-particle source and the condenser lens.

81. The apparatus of any one of clauses 70-80, wherein the first aperture array comprises an on-axis aperture configured to generate an on-axis beamlet, the on-axis beamlet being incident on an on-axis aperture of the second aperture array.

82. The apparatus of any one of clauses 70-81, wherein the first aperture array comprises an off-axis aperture configured to generate an off-axis beamlet, the off-axis beamlet incident on a corresponding off-axis aperture of the second aperture array.

83. The apparatus of clause 82, wherein the off-axis aperture of the first aperture array comprises an elongated aperture having rounded ends and a tapering width.

84. The apparatus of clause 83, wherein the off-axis aperture of the first aperture array has a curved form.

85. The apparatus of any one of clauses 82-84, wherein the off-axis aperture is oriented such that the width tapers towards the primary optical axis.

86. The apparatus of any one of clauses 82-85, wherein the condenser lens is configured to cause a portion of the off-axis beamlet to form a corresponding probing beamlet of the plurality of probing beamlets.

87. The apparatus of any one of clauses 70-86, wherein the second aperture array comprises a beam-limiting aperture array disposed between the condenser lens and an objective lens.

88. The apparatus of any one of clauses 70-87, wherein the second plurality of apertures is configured to determine a size and a shape of the plurality of probing beamlets.

89. The apparatus of any one of clauses 70-88, wherein the characteristic of the second aperture array comprises at least one of sizes, shapes, and arrangement of the second plurality of apertures.

90. The apparatus of any one of clauses 70-89, wherein the condenser lens comprises an electrostatic, electromagnetic, or an electromagnetic compound lens.

91. The apparatus of any one of clauses 68-90, wherein the first plurality of apertures comprises a plurality of off-axis apertures.

92. The apparatus of clause 91, wherein the plurality of off-axis apertures includes an aperture having a first off-axis aperture overlapping with a second off-axis aperture, wherein the first off-axis aperture enables the second aperture array to generate a first-off axis probing beamlet and the second off-axis aperture enables the second aperture array to generate a second off-axis probing beamlet.

93. The apparatus of any one of clauses 91-92, wherein each of the plurality of off-axis apertures of the first aperture array are separated by a substrate material of the first aperture array.

94. The apparatus of any one of clauses 81-93, wherein the on-axis aperture of the first aperture array is substantially circular.

95. The apparatus of any one of clauses 82-94, wherein an area of the on-axis aperture of the first aperture array is substantially similar to an area of the off-axis aperture.

96. A method of observing a sample using a charged-particle beam apparatus, the method comprising:
  activating a charged-particle source to generate a primary charged-particle beam;
  generating, using a first aperture plate and a second aperture plate of a first aperture array, a plurality of primary beamlets from the primary charged-particle beam, wherein the first aperture plate operates at a first voltage and the second aperture plate operates at a second voltage that is different from the first voltage for adjusting a path of a charged particle exiting the first aperture plate;
  generating, using a second aperture array, a plurality of probing beamlets corresponding to the plurality of primary beamlets; and
  generating, from the plurality of probing beamlets, a plurality of probe spots incident on a surface of the sample.

97. The method of clause 96, further comprising operating a third aperture plate at a third voltage substantially similar to the first voltage, wherein the first and the third voltage comprise a reference voltage.

98. The method of any one of clauses 96 and 97, further comprising adjusting, by electrically activating the second aperture plate, the path of the charged particle.

99. The method of clause 98, wherein electrically activating the second aperture plate comprises applying a voltage signal to generate the electric field.

100. The method of any one of clauses 96-99, further comprising adjusting a position of a plane of a condenser lens along a primary optical axis in relation to the first and the second aperture array.

101. The method of clause 100, wherein adjusting the position of the plane of the condenser lens modifies characteristics of the plurality of probing beamlets.

102. The method of any one of clauses 100 and 101, wherein adjusting the position of the plane of the condenser lens modifies currents of the plurality of probing beamlets.

103. The method of any one of clauses 96-102, wherein generating the plurality of primary beamlets comprises generating an on-axis beamlet and an off-axis beamlet.

104. The method of any one of clauses 100-103, further comprising causing, using the condenser lens, a portion of the off-axis beamlet to form a corresponding probing beamlet of the plurality of probing beamlets.

105. A non-transitory computer readable medium storing a set of instructions that is executable by one or more processors of a multi-beam apparatus having first and second aperture arrays to cause the multi-beam apparatus to perform a method comprising:
  activating a charged-particle source to generate a primary charged-particle beam;
  generating, using a first aperture plate and a second aperture plate of a first aperture array, a plurality of primary beamlets from the primary charged-particle beam, wherein the first and third aperture plates operate at substantially a first voltage and the second aperture plate operates at a second voltage that is different from the first voltage for adjusting a path of a charged particle exiting the first aperture plate;
  generating, using a second aperture array, a plurality of probing beamlets corresponding to the plurality of primary beamlets; and
  generating, from the plurality of probing beamlets, a plurality of probe spots incident on a surface of the sample.

106. A charged-particle beam apparatus comprising:
  a first aperture array comprising a first plurality of apertures configured to form a plurality of primary beamlets from a primary charged-particle beam, an aperture of the first plurality of apertures comprising:
    a first aperture plate configured to be at a first voltage; and
    a second aperture plate configured to be at a second voltage that is different from the first voltage for generating an electric field between the first and the second aperture plate; and
  a second aperture array configured to generate a probing beamlet from a corresponding primary beamlet, wherein a beam current of the probing beamlet is adjustable.

107. The apparatus of clause 106, wherein the electric field between the first and the second aperture plate is substantially fixed.

108. The apparatus of any one of clauses 106 and 107, wherein the beam current is discretely adjusted based on a size of the aperture of the first plurality of apertures in the first aperture array.

109. The apparatus of clause 106, wherein the electric field between the first and the second aperture plate is adjustable.

110. The apparatus of any one of clauses 106 and 109, wherein the beam current is adjusted based on the electric field between the first and the second aperture plate.

111. The apparatus of any one of clauses 106-110, wherein the electric field is configured to enable adjustment of a path of a charged particle of the primary charged-particle beam.

112. The apparatus of any one of clauses 106-111, further comprising a third aperture plate configured to be at a third voltage that is substantially similar to the first voltage.

113. The apparatus of clause 112, wherein the first and the third voltages comprise a reference voltage.

114. The apparatus of any one of clauses 111-113, wherein the second aperture plate comprises a charged-particle beam deflector configured to adjust the path of the charged particles in response to an electrical activation.

115. The apparatus of clause 114, wherein the charged-particle beam deflector comprises a single-pole deflector or a multi-pole deflector.

116. The apparatus of any one of clauses 114 and 115, wherein the electrical activation of the second aperture plate comprises a voltage signal being applied to generate the electric field.

117. The apparatus of clause 116, wherein the path of the charged particles is adjusted based on a characteristic of the voltage signal applied to the second aperture plate.

118. The apparatus of any one of clauses 106-117, wherein the aperture of the first plurality of apertures comprises:
  a first aperture in the first aperture plate;
  a second aperture in the second aperture plate; and
  a third aperture in the third aperture plate,
    wherein the second aperture plate is disposed between the first and the third aperture plates, and
    wherein a geometric center of the first, the second, and the third apertures are aligned.

119. The apparatus of clause 118, wherein the first and the second apertures are dissimilar in size, and wherein the first and the third apertures are substantially similar in size.

120. The apparatus of any one of clauses 118 and 119, wherein the third aperture plate is configured to block a portion of charged particles exiting the second aperture.

121. The apparatus of any one of clauses 106-120, wherein the first aperture array comprises an on-axis aperture configured to generate an on-axis beamlet, the on-axis beamlet being incident on an on-axis aperture of the second aperture array.

122. The apparatus of any one of clauses 106-121, wherein the first aperture array comprises an off-axis aperture configured to generate an off-axis beamlet, the off-axis beamlet incident on a corresponding off-axis aperture of the second aperture array.

123. The apparatus of clause 122, wherein the off-axis aperture of the first aperture array comprises an elongated aperture having rounded ends and a tapering width.

124. The apparatus of clause 123, wherein the off-axis aperture of the first aperture array has a curved form.

125. The apparatus of any one of clauses 122-124, wherein the off-axis aperture is oriented such that the width tapers towards the primary optical axis.

126. The apparatus of any one of clauses 122-125, further comprising a condenser lens configured to cause a portion of the off-axis beamlet to form the corresponding probing beamlet.

127. The apparatus of clause 126, wherein the second aperture array comprises a beam-limiting aperture array disposed between the condenser lens and an objective lens.

128. The apparatus of any one of clauses 106-127, wherein the second aperture array comprises a second plurality of apertures configured to generate a plurality of probing beamlets.

129. The apparatus of clause 128, wherein the second plurality of apertures is configured to determine a size and a shape of the plurality of probing beamlets.

130. The apparatus of any one of clauses 126-129, wherein the probing beamlet comprises a portion of charged particles of the corresponding primary beamlet based on at least a position of a plane of the condenser lens and a characteristic of the second aperture array.

131. The apparatus of clause 130, wherein the characteristic of the second aperture array comprises at least one of sizes, shapes, and arrangement of the second plurality of apertures.

132. The apparatus of any one of clauses 126-131, wherein the condenser lens comprises an electrostatic, electromagnetic, or an electromagnetic compound lens.

133. The apparatus of any one of clauses 106-132, wherein the first plurality of apertures comprises a plurality of off-axis apertures.

134. The apparatus of clause 133, wherein the plurality of off-axis apertures includes an aperture having a first off-axis aperture overlapping with a second off-axis aperture, wherein the first off-axis aperture enables the second aperture array to generate a first-off axis probing beamlet and the second off-axis aperture enables the second aperture array to generate a second off-axis probing beamlet.

135. The apparatus of any one of clauses 133 and 134, wherein each of the plurality of off-axis apertures of the first aperture array are separated by a substrate material of the first aperture array.

136. The apparatus of any one of clauses 121-135, wherein the on-axis aperture of the first aperture array is substantially circular.

137. The apparatus of any one of clauses 121-136, wherein an area of the on-axis aperture of the first aperture array is substantially similar to an area of the off-axis aperture.

138. A method of observing a sample using a charged-particle beam apparatus, the method comprising:
  activating a charged-particle source to generate a primary charged-particle beam;
  generating, using a first aperture plate and a second aperture plate of a first aperture array, a plurality of primary beamlets from the primary charged-particle beam, wherein the first aperture plate operates at a first voltage and the second aperture plate operates at a second voltage that is different from the first voltage, for adjusting a path of a charged particle exiting the first aperture plate;
  generating, using a second aperture array, a probing beamlet from a corresponding primary beamlet, wherein a beam current of the probing beamlet is adjustable; and
  generating, from the probing beamlet, a probe spot incident on a surface of the sample.

139. The method of clause 138, wherein adjusting the path of the charged particle comprises deflecting the charged particle based on an electric field formed between the first and the second aperture plate.

140. The method of clause 138 and 139, wherein the electric field between the first and the second aperture plate is substantially fixed, and wherein adjusting the beam current of the probing beamlet is based on a size of an aperture of the first aperture array.

141. The method of clause 138 and 139, wherein the electric field between the first and the second aperture plate is adjustable, and wherein adjusting the beam current of the probing beamlet comprises adjusting the electric field between the first and the second aperture plate.

142. The method of any one of clauses 139-141, wherein deflecting the charged particle is caused by electrically activating the second aperture plate by applying a voltage signal to generate the electric field.

143. The method of any one of clauses 138-142, further comprising operating a third aperture plate at a third voltage substantially similar to the first voltage, wherein the first and the third voltage comprise a reference voltage.

144. The method of any one of clauses 138-143, further comprising adjusting a position of a plane of a condenser lens along a primary optical axis in relation to the first and the second aperture array.

145. The method of clause 144, wherein adjusting the position of the plane of the condenser lens modifies a characteristic of the probing beamlet.

146. The method of any one of clauses 144 and 145, wherein adjusting the position of the plane of the condenser lens modifies the beam current of the probing beamlet.

147. The method of any one of clauses 144-146, further comprising causing, using the condenser lens, a portion of the off-axis primary beamlet to form the corresponding probing beamlet.

148. The method of any one of clauses 138-147, wherein generating the plurality of primary beamlets comprises generating an on-axis primary beamlet and an off-axis primary beamlet.

149. A non-transitory computer readable medium storing a set of instructions that is executable by one or more processors of a multi-beam apparatus having first and second aperture arrays to cause the multi-beam apparatus to perform a method comprising:
  activating a charged-particle source to generate a primary charged-particle beam;
  generating, using a first aperture plate and a second aperture plate of a first aperture array, a plurality of primary beamlets from the primary charged-particle beam, wherein the first aperture plate operates at a first voltage and the second aperture plate operates at a second voltage that is different from the first voltage, for adjusting a path of a charged particle exiting the first aperture plate;
  generating, using a second aperture array, a probing beamlet from a corresponding primary beamlet, wherein a beam current of the probing beamlet is adjustable; and
  generating, from the probing beamlet, a probe spot incident on a surface of the sample.

150. A charged-particle beam apparatus comprising:
  a set of pre-beamlet forming apertures configured to form a plurality of primary beamlets from a primary charged-particle beam; and
  a beam-limit aperture configured to form a probing beamlet from a corresponding primary beamlet, wherein a beam current of the probing beamlet is determined based on a characteristic of an aperture of the set of pre-beamlet forming apertures forming the primary beamlet,
    wherein each aperture of the set of pre-beamlet forming apertures is configured to influence the beam current of the probing beamlet formed.

151. The apparatus of clause 150, wherein the characteristic of the aperture of the set of pre-beamlet forming apertures comprises a size, a shape, or a location of the aperture.

152. The apparatus of any one of clauses 150 and 151, wherein the beam current of the probing beamlet is discretely adjusted based on the size of the aperture of the set of pre-beamlet forming apertures.

153. The apparatus of any one of clauses 150-152, comprising:
  a first array of a plurality of sets of pre-beamlet forming apertures; and
  a second array of a plurality of beam-limit apertures disposed downstream of the first array along a primary optical axis of the primary charged-particle beam.

154. The apparatus of any one of clauses 150-153, wherein the aperture of the set of pre-beamlet forming apertures forming the probing beamlet is determined based on a characteristic of a condenser lens.

155. The apparatus of clause 154, wherein the characteristic of the condenser lens comprises a position of a plane of the condenser lens along the primary optical axis.

156. The apparatus of any one of clauses 154 and 155, wherein a change of the position of the plane of the condenser lens is configured to affect the beam current of the probing beamlet.

157. The apparatus any one of clauses 154-156, wherein the condenser lens is configured to influence the beam current of the probing beamlet by directing a portion of the primary charged-particle beam to pass through a different aperture of the set of pre-beamlet forming apertures.

158. The apparatus of any one of clauses 155-157, wherein:
  the condenser lens located in a first position of the plane is configured to cause a first portion of the primary charged-particle beam to pass through a first aperture of the set of pre-beamlet forming apertures to form a first primary beamlet; and the condenser lens located in a second position of the plane is configured to cause a second portion of the primary charged-particle beam to pass through a second aperture of the set of pre-beamlet forming apertures to form a second primary beamlet.

159. The apparatus of any one of clauses 153-158, wherein the first array comprises an on-axis aperture configured to generate an on-axis primary beamlet, the on-axis primary beamlet being incident on an on-axis aperture of the second array.

160. The apparatus of any one of clauses 153-159, wherein the set of pre-beamlet forming apertures comprises a plurality of off-axis pre-beamlet forming apertures configured to generate an off-axis primary beamlet, the off-axis primary beamlet incident on a corresponding off-axis beam-limit aperture of the second array.

161. The apparatus of clause 160, wherein each of the off-axis pre-beamlet forming apertures are separated by a substrate material of the first array.

162. The apparatus of any one of clauses 160 and 161, wherein the plurality of off-axis pre-beamlet forming apertures are disposed along a curved path.

163. The apparatus of any one of clauses 160-162, wherein the plurality of off-axis pre-beamlet forming apertures includes at least two apertures having a different size.

164. The apparatus of any one of clauses 160-163, wherein the plurality of off-axis pre-beamlet forming apertures are sized to influence a beam current of the primary beamlet generated upon passing through an aperture of the plurality of off-axis pre-beamlet forming apertures.

165. The apparatus of any one of clauses 160-164, wherein apertures of the plurality of off-axis pre-beamlet forming apertures have a uniform pitch.

166. The first aperture array of any one of clauses 160-164, wherein apertures of the plurality of off-axis pre-beamlet forming apertures have a non-uniform pitch.

A non-transitory computer readable medium may be provided that stores instructions for a processor of a controller (e.g., controller 40 of FIG. 1) to carry out image inspection, image acquisition, stage positioning, beam focusing, electric field adjustment, beam bending, condenser lens adjusting, activating charged-particle source, beam deflecting, electrical activation of active apertures, etc. Common forms of non-transitory media include, for example, a floppy disk, a flexible disk, hard disk, solid state drive, magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), a cache, a register, any other memory chip or cartridge, and networked versions of the same.

It will be appreciated that the embodiments of the present disclosure are not limited to the exact construction that has been described above and illustrated in the accompanying drawings, and that various modifications and changes may be made without departing from the scope thereof. The present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The descriptions above are intended to be illustrative, not limiting. Thus, it will be apparent to one skilled in the art that modifications may be made as described without departing from the scope of the claims set out below.

The invention claimed is:

1. A charged-particle beam apparatus comprising:
a charged-particle source configured to generate a primary charged-particle beam along a primary optical axis;
a first aperture array comprising a first plurality of apertures configured to generate a plurality of primary beamlets from the primary charged-particle beam;
a condenser lens comprising a plane adjustable along the primary optical axis; and
a second aperture array comprising a second plurality of apertures configured to generate a plurality of probing beamlets,
wherein each of the plurality of probing beamlets comprises a portion of charged particles of a corresponding primary beamlet, and
wherein the portion of the charged particles is determined based on at least a position of the plane of the condenser lens and characteristics of the second aperture array, and
wherein an off-axis aperture of the first plurality of apertures comprises an elongated aperture having a first rounded end close to the primary optical axis and a second rounded end radially opposite from the first rounded end, and wherein a radius of curvature of the first rounded end is smaller than a radius of curvature of the second rounded end.

2. The apparatus of claim 1, wherein the first aperture array comprises a pre-beamlet forming aperture array disposed between the charged-particle source and the condenser lens.

3. The apparatus of claim 1, wherein the first aperture array comprises an on-axis aperture configured to generate an on-axis beamlet, the on-axis beamlet being incident on an on-axis aperture of the second aperture array.

4. The apparatus of claim 1, wherein the off-axis aperture is configured to generate an off-axis beamlet to be incident on a corresponding off-axis aperture of the second aperture array.

5. The apparatus of claim 1, wherein the off-axis aperture has a curved form.

6. The apparatus of claim 4, wherein the off-axis aperture is oriented such that a width tapers towards the primary optical axis.

7. The apparatus of claim 4, wherein the condenser lens is configured to cause a portion of the off-axis beamlet to form a corresponding probing beamlet of the plurality of probing beamlets.

8. The apparatus of claim 1, wherein the second aperture array comprises a beam-limiting aperture array disposed between the condenser lens and an objective lens.

9. The apparatus of claim 1, wherein the second plurality of apertures is configured to determine a size and a shape of the plurality of probing beamlets.

10. The apparatus of claim 1, wherein the characteristics of the second aperture array comprises at least one of sizes, shapes, and arrangement of the second plurality of apertures.

11. The apparatus of claim 1, wherein the condenser lens comprises an electrostatic, electromagnetic, or an electromagnetic compound lens.

12. The apparatus of claim 1, wherein the first plurality of apertures comprises a plurality of off-axis apertures.

13. The apparatus of claim 12, wherein the plurality of off-axis apertures includes an aperture having a first off-axis aperture overlapping with a second off-axis aperture, wherein the first off-axis aperture enables the second aperture array to generate a first-off axis probing beamlet and the second off-axis aperture enables the second aperture array to generate a second off-axis probing beamlet.

14. The apparatus of claim 1, wherein the off-axis aperture is shaped as a conical frustrum with rounded ends.

15. The apparatus of claim 12, wherein the plurality of off-axis apertures is arranged radially around the primary optical axis.

16. The apparatus of claim 5, wherein the off-axis aperture is asymmetrical along a central axis of the off-axis aperture parallel to the primary optical axis.

17. A non-transitory computer readable medium storing a set of instructions that is executable by one or more processors of a multi-beam apparatus having first and second aperture arrays to cause the multi-beam apparatus to perform a method comprising:
activating a charged-particle source to generate a primary charged-particle beam; and
adjusting a position of a plane of a condenser lens along a primary optical axis in relation to the first aperture array and the second aperture array, wherein:
the first aperture array is configured to generate a plurality of primary beamlets from the primary charged-particle beam using a first plurality of apertures, wherein an off-axis aperture of the first plurality of apertures comprises an elongated aperture having a first rounded end close to the primary optical axis and a second rounded end radially opposite from the first rounded end, and wherein a radius of curvature of the first rounded end is smaller than a radius of curvature of the second rounded end, wherein a portion of charged particles of a primary beamlet of the plurality of primary beamlets forms a corresponding probing beamlet, and wherein the portion of the charged particles is determined based on at least a position of the plane of the condenser lens and characteristics of the second aperture array.

* * * * *